(12) United States Patent
Ryno et al.

(10) Patent No.: US 7,039,534 B1
(45) Date of Patent: May 2, 2006

(54) CHARGING MONITORING SYSTEMS

(76) Inventors: Ronald A. Ryno, 1215 N. Acacia Dr., Gilbert, AZ (US) 85233; Shirlee M. Ryno, 1215 N. Acacia Dr., Gilbert, AZ (US) 85233

( * ) Notice: Subject to any disclaimer, the term of this patent is extended or adjusted under 35 U.S.C. 154(b) by 31 days.

(21) Appl. No.: 10/970,583

(22) Filed: Oct. 20, 2004

Related U.S. Application Data

(60) Provisional application No. 60/517,150, filed on Nov. 3, 2003.

(51) Int. Cl.
*G01R 31/36* (2006.01)

(52) U.S. Cl. .......................... 702/63; 702/64; 324/427; 324/430; 320/134; 320/135; 320/136; 320/163

(58) Field of Classification Search .................. 702/63, 702/64, 65, 66; 324/427, 430, 433; 320/150, 320/164, 134, 161, 136, 135, 163
See application file for complete search history.

(56) References Cited

U.S. PATENT DOCUMENTS

| | | | |
|---|---|---|---|
| 3,832,629 A | | 8/1974 | Cernek, Jr. |
| 4,163,186 A | | 7/1979 | Haley |
| 4,390,841 A | * | 6/1983 | Martin et al. ................ 324/427 |
| 4,558,281 A | * | 12/1985 | Codd et al. .................. 324/433 |
| 4,876,513 A | * | 10/1989 | Brilmyer et al. ............. 324/427 |
| 4,949,046 A | * | 8/1990 | Seyfang ....................... 324/427 |
| 5,047,961 A | * | 9/1991 | Simonsen ..................... 702/63 |
| 5,218,288 A | * | 6/1993 | Mickal et al. ............... 320/134 |
| 5,321,627 A | | 6/1994 | Reher |
| 6,407,663 B1 | | 6/2002 | Huggett |

* cited by examiner

*Primary Examiner*—John Barlow
*Assistant Examiner*—Hien Vo
(74) *Attorney, Agent, or Firm*—Stoneman Law Offices, Ltd.; Martin L. Stoneman

(57) ABSTRACT

An electronic system for the continuous monitoring of voltage charge within the electrical system of a motor vehicle having an electrical generation source and a secondary electrochemical cell or battery. The system comprises a programmable in-vehicle monitor having a flashing LED indicator that alerts the vehicle operator of the condition of the electrical system. An example of the invention comprises a plug-in housing for use in a vehicle accessory-power-socket. Additionally, a method of market distribution is disclosed.

30 Claims, 16 Drawing Sheets

CHARGING MONITORING SYSTEMS

CROSS-REFERENCE TO RELATED APPLICATION

The present application is related to and claims priority from prior provisional application Ser. No. 60/517,150, filed Nov. 3, 2003, entitled "CHARGING MONITORING SYSTEM", the contents of which are incorporated herein by this reference and are not admitted to be prior art with respect to the present invention by the mention in this cross-reference section.

BACKGROUND

This invention relates to providing a system for improved monitoring of a vehicle electrical system. More specifically, this invention relates to the continuous monitoring of voltage charge within the electrical system of a motor vehicle having an electrical generation source and a secondary, typically electrochemical, cell or battery.

The lead-acid storage battery has proven to be an efficient and reliable electrochemical energy source since its commercial introduction about 125 years ago. In addition to being a highly efficient energy source, lead-acid storage batteries are also relatively inexpensive to produce and therefore lend themselves to a broad range of applications.

Motorized vehicles are one common example of a commercial use for lead-acid storage batteries. Typically, electrical systems found within motorized vehicles comprise an alternator, secondary storage battery, circuit controlling devices (such as an ignition switch) and a variety of current-drawing electrical loads. During normal operation, the battery is used to start the vehicle's engine, thereinafter the engine drives an alternator that charges the secondary storage battery while the engine is operating. To charge the battery, the alternator must produce an output voltage higher than that of the open-circuit voltage of the battery. This "elevated" voltage condition causes current to flow into the battery, thereby charging it. It is well known that the performances of motor-driven alternators vary greatly. This is especially true of compact alternator units employed in, for example, production of motorcycles. Depending on the output of the alternator, the combined loads of the various electrical devices, and the condition of the battery, the voltage within the electrical system may fluctuate between conditions of severe voltage overcharge and severe voltage undercharge. Both overcharge and undercharge conditions are potentially damaging to electrical system components, to the point of rendering the host vehicle inoperable. Often, the motor vehicle operator is unaware of a pending failure until the vehicle fails to start on attempting to start the engine.

Existing systems to meter the voltage status of vehicular electrical systems have been either inexpensive and acutely inaccurate or relatively accurate but exceedingly expensive and complex to implement. Often an indication of impending failure is marked by very small fluctuations in electrical system voltage. These small fluctuations in voltage are presently undetectable by inexpensive charge warning indicators. Therefore, a need exists within the motor vehicle industry for an inexpensive but highly accurate predictive device to monitor the voltage condition of a vehicular electrical system.

OBJECTS AND FEATURES OF THE INVENTION

A primary object and feature of the present invention is to provide a system for improved monitoring of a vehicle electrical system overcoming the above-stated problems.

It is a further object and feature of the present invention to provide such a system to monitor a vehicle's charging system voltage when the vehicle's charging system is in operation.

It is another object and feature of the present invention to provide such a system to monitor a vehicle's secondary storage battery voltage when the vehicle charging system is not in operation.

It is a further object and feature of the present invention to provide such a system that is programmable to match a specific vehicle application.

It is yet a further object and feature of the present invention to provide such a system to monitor a vehicle's charging system voltage by engaging the vehicle's accessory power plug.

It is an additional object and feature of the present invention to provide such a system that is supplied as an OEM product or consumer aftermarket kit.

It is a further object and feature of the present invention to provide such a system that utilizes surface mounted electronic components to produce systems having a small format circuit board.

It is an additional object and feature of the present invention to provide such a system that utilizes a plug-in-type edge connector to permit testing and programming of the system at any time after system manufacture.

It is a further object and feature of the present invention to provide such a system and method, permitting electronic component calibration to provide improved monitoring accuracy.

It is a further object and feature of the present invention to provide such a system that permits precise calibration of system components.

A further primary object and feature of the present invention is to provide such a system that is efficient, inexpensive, and handy. Other objects and features of this invention will become apparent with reference to the following descriptions.

SUMMARY OF THE INVENTION

In accordance with a preferred embodiment hereof, this invention provides a monitoring system, for vehicle-user monitoring at least one vehicular electrical charging system having at least one current-carrying circuit, such circuit comprising at least one operating voltage and at least one rechargeable energy storage battery, such system comprising: continuous-accessor means for continuously accessing the at least one operating voltage of the at least one current-carrying circuit; sampler means, electrically coupled to such continuous-accessor means, for sampling the at least one operating voltage; sample-voltage valuer means, electrically coupled to such sampler means, for providing at least one sampled voltage value for the at least one operating voltage; benchmark memory storage means for storing a plurality of programmable benchmark voltage values for the at least one operating voltage; sampled-voltage-value storage means, electrically coupled to such sampler means, for storing the at least one sampled voltage value; logic-processor means, electrically coupled to such benchmark memory storage means and such sampled-voltage-value storage means, for logically processing the at least one sampled voltage value, wherein such logic-processor means comprises sampled-voltage indicator means for providing at least one indication of the at least one sampled voltage value, comparator means for comparing the at least one indication of the at least one sampled voltage value with at least one of the plurality of programmable benchmark voltage values, and output signal generator means for generating at least one output signal from such comparator means; and user-sensable signalling device controller means, electrically coupled with such output signal generator means, for controlling at least one user-sensable signalling device.

In accordance with another preferred embodiment hereof, this invention provides a monitoring system, for vehicle-user monitoring at least one vehicular electrical charging system having at least one current-carrying circuit, such circuit comprising at least one operating voltage and at least one rechargeable energy storage battery, such system comprising: at least one continuous-accessor adapted to continuously access the at least one operating voltage of the at least one current-carrying circuit; at least one sampler, electrically coupled to such at least one continuous-accessor, adapted to sample the at least one operating voltage; at least one sample-voltage valuer, electrically coupled to such at least one sampler, structured and arranged to provide at least one sampled voltage value for the at least one operating voltage; at least one benchmark memory storage to store a plurality of programmable benchmark voltage values for the at least one operating voltage; at least one sampled-voltage-value storage, electrically coupled to such at least one sampling means, to store the at least one sampled voltage value; at least one logic-processor, electrically coupled to such at least one benchmark memory storage and such at least one sampled-voltage-value storage, for logically processing the at least one sampled voltage value, wherein such at least one logic-processor comprises at least one sampled-voltage indicator structured and arranged to provide at least one indication of the at least one sampled voltage value, at least one comparator to compare the at least one indication of the at least one sampled voltage value with at least one of the plurality of programmable benchmark voltage values, and at least one output signal generator to generate at least one output signal from such at least one comparator; and at least one user-sensable signalling device controller, electrically coupled with such at least one output signal generator, structured and arranged to control at least one user-sensable signalling device. Moreover, it provides such a monitoring system further comprising at least one user-sensable-signalling device, coupled to such at least one output signal generator, structured and arranged to provide at least one user-sensable signal.

Additionally, it provides such a monitoring system wherein such at least one user-sensable-signalling device is adapted to provide at least four unique user-sensable signals. Also, it provides such a monitoring system wherein such at least one user-sensable signalling device comprises a single illumination source. In addition, it provides such a monitoring system wherein such at least one logic-processor is programmable. And, it provides such a monitoring system wherein such at least one logic-processor comprises electrically erasable programmable read-only memory.

Further, it provides such a monitoring system wherein such at least one sample voltage-valuer comprises at least one analog-to-digital converter structured and arranged to convert the at least one operating voltage from at least one analog signal to at least one digital value. Even further, it provides such a monitoring system wherein such at least one continuous-accessor is adapted to sample the at least one operating voltage from not more than one of the at least one current-carrying circuits. Moreover, it provides such a monitoring system wherein such at least one sampler comprises at least one circuit structured and arranged to electrically process the at least one operating voltage.

Additionally, it provides such a monitoring system further comprising: at least one calibration tester adapted to perform at least one calibration test to measure actual performance of at least one monitoring function of such monitoring system; wherein such at least one calibration tester is adapted to produce calibration test data on performing the at least one calibration test. Also, it provides such a monitoring system further comprising at least one programmer adapted to program such at least one logic-processor.

In addition, it provides such a monitoring system wherein such at least one programmer comprises at least one control program adapted to control the logical processing of the at least one sample voltage value. And, it provides such a monitoring system wherein: such at least one control program comprises at least one calibrator adapted to calibrate the monitoring performance of such monitoring system to match at least one target monitoring performance; and such at least one calibrator calibrates the operational performance of such monitoring system by utilizing the at least one set of calibration test data.

Further, it provides such a monitoring system further comprising: at least one circuit-supporting substrate adapted to support such at least one circuit; wherein such at least one circuit-supporting substrate comprises at least one peripheral edge; and such at least one peripheral edge comprises at least one electrical edge-coupler adapted to permit at least one removably engageable electrical coupling between such at least one circuit and at least one other circuit of at least one other device. Even further, it provides such a monitoring system wherein such at least one other device comprises such at least one calibration tester.

Moreover, it provides such a monitoring system wherein such at least one other device comprises such at least one programmer. Additionally, it provides such a monitoring system wherein such at least one other device comprises the at least one vehicular electrical charging system. Also, it provides such a monitoring system wherein such at least one calibration tester comprises such at least one programmer. In addition, it provides such a monitoring system wherein such at least one edge connector comprises at least one electrically conductive contact electrically coupled to such at least one circuit. And, it provides such a monitoring system wherein such at least one edge connector comprises: at least one electrically conductive data contact adapted to conduct at least one data signal to at least one data using component of such monitoring system; and at least one electrically conductive power contact adapted to conduct electrical power to such at least one circuit.

Further, it provides such a monitoring system wherein such at least one circuit comprises at least one first filter adapted to filter radio frequency energy from the at least one operating voltage. Even further, it provides such a monitoring system wherein such at least one circuit further comprises: at least one second filter adapted to filter out conducted high frequency noise from the at least one operating voltage; and at least one third filter adapted to filter out conducted low frequency noise from the at least one operating voltage.

Even further, it provides such a monitoring system wherein such at least one continuous-accessor comprises:

one positive electrical connection to the at least one current-carrying circuit; and one grounded connection. Even further, it provides such a monitoring system wherein such at least one continuous-accessor comprises at least one vehicular accessory power socket adapter to electrically engage at least one vehicular accessory power socket. Even further, it provides such a monitoring system wherein: such at least one vehicular accessory power socket adapter comprises at least one cylindrical housing; and such at least one cylindrical housing comprises at least one interior cavity portion adapted to essentially contain such monitoring system.

In accordance with another preferred embodiment hereof, this invention provides a monitoring system, for vehicle-user monitoring at least one vehicular electrical charging system having at least one current-carrying circuit, such circuit comprising at least one operating voltage, at least one rechargeable energy storage battery and at least one accessory power socket, such system comprising: at least one continuous-accessor adapted to continuously access the at least one operating voltage of the at least one current-carrying circuit by engaging the at least one accessory power socket; at least one sampler, electrically coupled to such at least one continuous-accessor, adapted to sample the at least one operating voltage; at least one sample-voltage valuer, electrically coupled to such sampler means, structured and arranged to provide at least one sampled voltage value for the at least one operating voltage; at least one benchmark memory storage to store a plurality of programmable benchmark voltage values for the at least one operating voltage; at least one sampled-voltage-value storage, electrically coupled to such at least one sampling means, to store the at least one sampled voltage value; at least one logic-processor, electrically coupled to such at least one benchmark memory storage and such at least one sampled-voltage-value storage, for logically processing the at least one sampled voltage value, wherein such at least one logic-processor comprises at least one sampled-voltage indicator structured and arranged to provide at least one indication of the at least one sampled voltage value, at least one comparator to compare the at least one indication of the at least one sampled voltage value with at least one of the plurality of programmable benchmark voltage values, and at least one output signal generator to generate at least one output signal from such at least one comparator; and at least one user-sensable signalling device controller, electrically coupled with such at least one output signal generator, structured and arranged to control at least one user-sensable signalling device.

In accordance with another preferred embodiment hereof, this invention provides a kit system, containing at least one monitoring device for monitoring at least one vehicular electrical charging system, such kit system comprising: at least one continuous-accessor adapted to continuously access at least one operating voltage of the at least one current-carrying circuit by engaging the at least one accessory power socket; at least one sampler, electrically coupled to such at least one continuous-accessor, adapted to sample the at least one operating voltage; at least one sample-voltage valuer, electrically coupled to such sampler means, structured and arranged to provide at least one sampled voltage value for the at least one operating voltage; at least one benchmark memory storage to store a plurality of programmable benchmark voltage values for the at least one operating voltage; at least one sampled-voltage-value storage, electrically coupled to such at least one sampling means, to store the at least one sampled voltage value; at least one logic-processor, electrically coupled to such at least one benchmark memory storage and such at least one sampled-voltage-value storage, for logically processing the at least one sampled voltage value, wherein such at least one logic-processor comprises at least one sampled-voltage indicator structured and arranged to provide at least one indication of the at least one sampled voltage value, at least one comparator to compare the at least one indication of the at least one sampled voltage value with at least one of the plurality of programmable benchmark voltage values, and at least one output signal generator to generate at least one output signal from such at least one comparator; and at least one user-sensable signalling device controller, electrically coupled with such at least one output signal generator, structured and arranged to control at least one LED; at least one LED socket having at least one retaining ring; at least one ring connector; at least one butt connector; at least one cable tie; at least one installation and operating instruction; and at least one consumer package.

In accordance with another preferred embodiment hereof, this invention provides a kit system, containing at least one monitoring device for monitoring at least one vehicular electrical charging system, such kit system comprising: at least one monitoring device comprising; at least one continuous-accessor adapted to continuously access at least one operating voltage of such at least one vehicular electrical charging system by engaging at least one vehicular accessory power socket, at least one sampler, electrically coupled to such at least one continuous-accessor, structured and arranged to sample the at least one operating voltage, at least one sampled voltage-value generator, electrically coupled to such at least one sampler, to provide at least one sampled voltage value for the at least one operating voltage, at least one benchmark memory device to store a plurality of programmable benchmark voltage values for the at least one operating voltage, at least one storage memory, electrically coupled to such at least one sampler, to store the at least one sampled voltage value, and at least one logic-processor, electrically coupled to such at least one benchmark memory device and such at least one storage memory, structured and arranged to logically process the at least one sampled voltage value, wherein such at least one logic-processor comprises, at least one sampled voltage indicator adapted to provide at least one indication of sampled voltage value, at least one comparator to compare the at least one indication of sampled voltage value with at least one of the plurality of programmable benchmark voltage values, at least one output signal device adapted to provide at least one output signal from such at least one comparator, and at least one visual signal device controller, electrically coupled with such at least one output signal device, structured and arranged to control at least one visual signal device; at least one installation and operating instruction; and at least one consumer package.

In accordance with another preferred embodiment hereof, this invention provides a method relating to improving the accuracy of a vehicular voltage monitoring system comprising the steps of: ascertaining at least one baseline operational characteristic of such vehicular voltage monitoring system by operational testing of such voltage monitoring system; selecting at least one target operational characteristic of such vehicular voltage monitoring system; and adjusting such at least one baseline operational characteristic of such vehicular voltage monitoring system to match such at least one target operational characteristic; wherein such adjusting at least includes altering at least one software component of such vehicular voltage monitoring system.

In accordance with another preferred embodiment hereof, this invention provides a method for providing vehicle-specific voltage monitoring systems for each of a plurality of differing motor vehicles each having at least one electrical charging system, such method comprising the steps of: identifying at least one plurality of such differing motor vehicles; assembling vehicle-specific benchmark voltage data for each one of such plurality of differing motor vehicles; providing at least one in-vehicle programmable device structured and arranged to sample voltage from such electrical charging system and compare such sampled voltage to the vehicle-specific benchmark voltage data; providing vehicle-specific software, using the vehicle-specific benchmark voltage data, such vehicle-specific software being downloadable to provide at least one program to such at least one in-vehicle programmable device; and providing to vehicle aftermarkets such vehicle-specific voltage monitoring systems.

BRIEF DESCRIPTION OF THE DRAWINGS

FIG. 10b shows a top view of a surface mount board used to assemble the monitoring system of FIG. 10a.

FIG. 14b shows a second portion of a schematic diagram illustrating the circuit arrangements of the test/programming fixture according to FIG. 14a.

DETAILED DESCRIPTION OF THE BEST MODES AND PREFERRED EMBODIMENTS OF THE INVENTION

Figure 1:
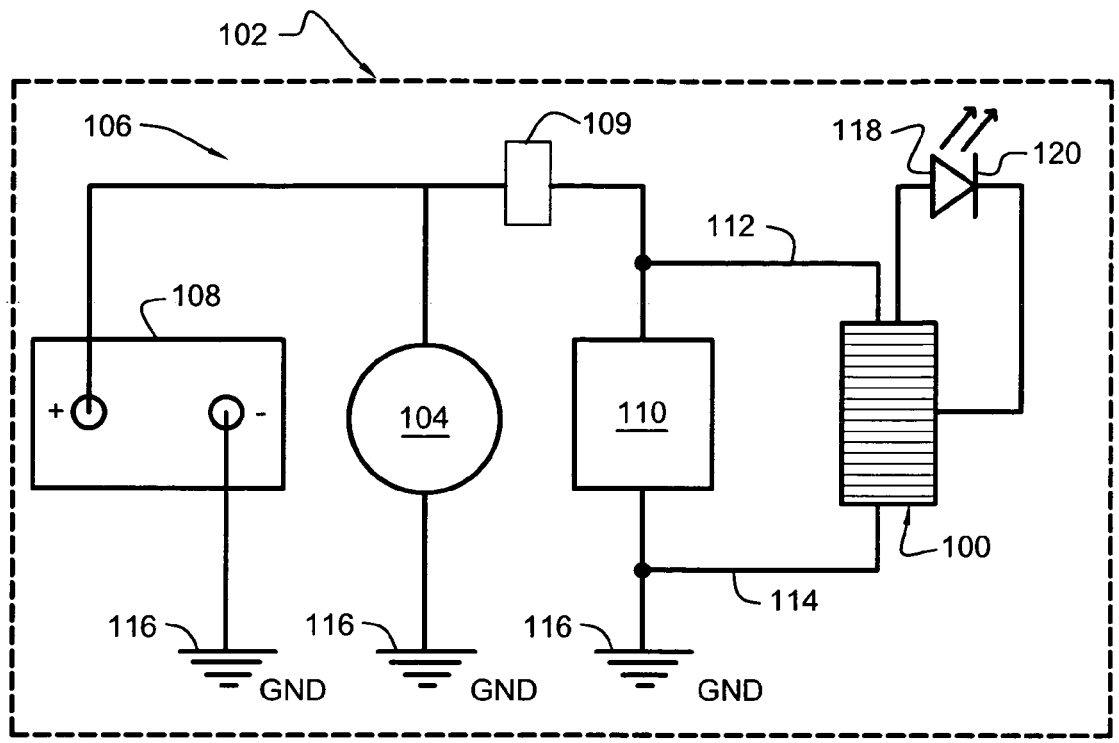
FIG. 1 shows, in simplified block diagram form, a typical host vehicle utilizing a monitoring system according to a preferred embodiment of the present invention.

Referring now to the drawings, FIG. 1 illustrates, in block diagram form, typical host vehicle 102 utilizing monitoring system 100 to continuously monitor the operational status of electrical system 106. For the purposes of best following the teachings of the present disclosure, it is assumed that electrical system 106 resides within a motorized host vehicle, such as, for example, a motorcycle, car, or boat, and that the nominal operating voltage of electrical system 106 is twelve (12) volts DC.

In the diagrammatic example of FIG. 1, electrical system 106 typically comprises secondary storage battery 108, alternator 104, ignition control device 109 and electrical load 110, as shown. Electrical load 110 typically comprises such diverse current-drawing devices as a starter motor, headlights, gauges, fans and similar electrical equipment. During normal operation, alternator 104 charges battery 108 when the engine of host vehicle 102 is operating. To charge battery 108, alternator 104 produces a voltage higher than that of the open-circuit voltage of battery 108. This "elevated" voltage condition causes current to flow into battery 108, thereby charging it. Since battery 108 and alternator 104 are interconnected with the remainder of electrical system 106, the charging voltage (or lack thereof) is impressed on the entire electrical system 106, as shown. Monitoring system 100 preferably effectively utilizes this continuity of ignition circuit pathways to permit a simple and straightforward integration of monitoring system 100 within electrical system 106, as will be further described below.

Preferably, monitoring system 100 operates by initially sampling the voltage within electrical system 106, at any convenient point having power when the ignition circuit is on and alternator 104 is operating. Additionally, monitoring system 100 is preferably adapted to monitor the status of battery 108 if the ignition switch (ignition circuit) is on (closed) and alternator 104 of host vehicle 102 is not operating.

The preferred integration of monitoring system 100 into electrical system 106 requires two physical points of electrical connection comprising positive lead 112 and negative lead 114, as shown (at least embodying herein continuous-accessor means for continuously accessing the at least one operating voltage of the at least one current-carrying circuit and further herein embodying wherein such continuous-accessor means is adapted to sample the at least one operating voltage from not more than one of the at least one current-carrying circuits). Positive lead 112 of monitoring system 100 is preferably connected to any readily accessible circuit point within electrical system 106 (that has power when the ignition circuit is on), as shown. Negative lead 114 of monitoring system 100 is preferably connected to vehicle ground 116, as shown. It should be noted that monitoring system 100 is preferably designed to draw such small amounts of electrical current (approximately 18 milliamps when monitoring system 100 is operating) that monitoring system 100 can be connected to virtually any powered circuit point within host vehicle 102, as shown.

Preferably, positive lead 112 and negative lead 114 are electrically coupled to circuitry (at least embodying herein wherein such sampler means comprises circuit means for electrically processing the at least one operating voltage and further embodying herein sampler means, electrically coupled to such continuous-accessor means, for sampling the at least one operating voltage), internal to monitoring system 100, that preferably samples and processes the voltage within electrical system 106. Preferably, monitoring system 100 comprises visual indicator 118 (at least embodying herein user-sensable-signalling means, coupled to such output signal generator means, for providing at least one user-sensable signal and further embodying herein, wherein such user-sensable signalling means comprises a single illumination source), most preferably light emitting diode (LED) 120, to alert a user of the status of electrical system 106, as shown.

In preferred operation, monitoring system 100 indicates the status of electrical system 106 by generating visually distinct flash patterns at LED 120, each flash pattern corresponding to a specific voltage condition within electrical system 106. In the preferred embodiment of FIG. 1, monitoring system 100 preferably generates four distinct flash patterns as described in connection with FIG. 2 below (at least embodying herein wherein such user-sensable signalling means is adapted to provide at least four unique user-sensable signals).

Figure 2:
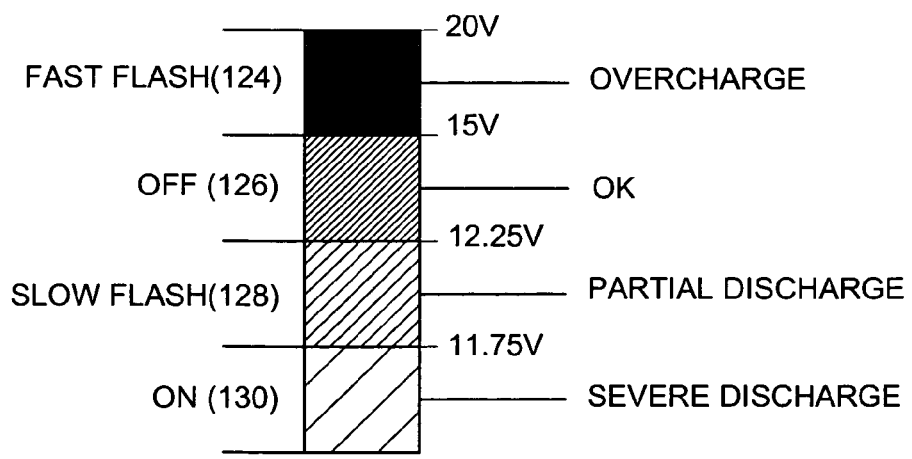
FIG. 2 graphically shows the operation of a visual indicator in response to detected voltage conditions within the host vehicle electrical system according to the preferred embodiment of FIG. 1.

In reference to FIG. 2 and with continued reference to FIG. 1, FIG. 2 graphically illustrates the preferred operation of monitoring system 100 and visual indicator 118 in response to the detected voltage within electrical system 106. Preferably, LED 120 is controlled by an internal micro-controller programmed to illuminate LED 120 at a predetermined patterned rate based on the voltage sample taken from electrical system 106. FIG. 2 summarizes preferred programmed flash rates at LED 120 and corresponding sampled voltage ranges for a single representative application (such as a motorcycle). It should be noted that the monitoring system is preferably highly customizable to a wide range of unique applications and that the example voltage values noted within FIG. 2 are representative of only one of many possible application based presets.

Preferably, LED 120 illuminates to produce a rapid series of easily discernable flashes under LED fast flash condition 124. Preferably, LED fast flash condition 124 indicates that electrical system 106 is overcharging. Assume, for example, that under LED fast flash condition 124, monitoring system 100 has detected a charging output of 15 volts (nominal) or higher within electrical system 106. The operator of host vehicle 102 may, based on this indication, reliably predict that an excessive voltage condition exists that could damage battery 108 within a short time.

Preferably, LED 120 in not illuminated during LED off condition 126. Preferably, Under LED off condition 126, monitoring system 100 has detected that the output of electrical system 106 is sufficient to keep battery 106 charged. Preferably, LED off condition 126 indicates to the operator that electrical system 106 is functioning within normal parameters.

Preferably, LED 120 illuminates in a slow repetition of easily discernable flashes during LED slow flash condition 128. Preferably, monitoring system 100 produces LED slow flash condition 128 on detecting that battery 108 is not being charged completely. Under this condition, monitoring system 100 has, for example, detected a voltage between 12.25 V and 11.75 V (nominal). Preferably, by observing LED slow flash condition 128, the operator of host vehicle 102 is alerted that electrical system 106 in not keeping up with electrical load 110. This condition generally indicates that too many current drawing electrical accessories are being operated at once. In addition, this indication alerts the operator that host vehicle 102 could contain a defective regulator or alternator 104. Furthermore, on observing this indication, the operator will reliably predict that, although battery 108 is not being completely charged, battery 108 will generally restart the vehicle if the condition has not persisted for an extended period.

Preferably, LED 120 is continuously illuminated during LED "on steady" condition 130. Preferably, LED "on steady" condition 130 indicates that monitoring system 100 has detected that battery 108 is being severely undercharged. Under this condition, the voltage sampled, for example, by monitoring system 100 has dropped below 11.75 V (nominal). A vehicle operator observing LED "on steady" condition 130 is alerted that battery 108 is being rapidly discharged and that battery 108 may not start the vehicle again.

Monitoring system 100 is also preferably adapted to provide an indication of battery status when the engine and alternator 104 of host vehicle 102 are not operating. In this mode, monitoring system 100 preferably indicates the status of battery 108. If battery 108 is fully charged, LED 120 will typically be off when the ignition circuit is on (closed). After a short period, LED 120 may enter LED slow flash condition 128 due to internal electrical drain on battery 108 imposed by operating components or shorts within electrical system 106. LED slow flash condition 128 preferably indicates that the voltage of battery 108 has dropped to 12.25 or below. If the LED stays on without flashing that preferably indicates that battery voltage is less than 11.75 volts indicating battery 108 may require charging in order to start host vehicle 102.

Figure 3:
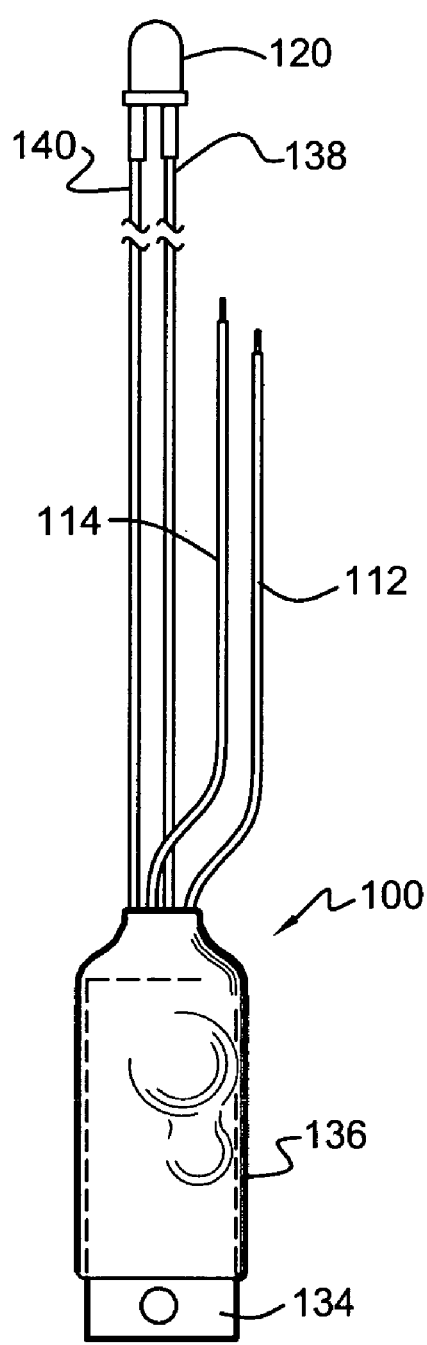
FIG. 3 shows a perspective view of the monitoring system according to a preferred embodiment of FIG. 1.

FIG. 3 is a perspective view of monitoring system 100 according to a preferred embodiment of the present invention. Preferably, monitoring system 100 comprises circuit board 134, positive lead 112, negative lead 114, LED anode wire 138, LED cathode wire 140, LED 120 and protective jacket 136, as shown. Preferably, the component structure of monitoring system 100 is readily adaptable to dual in-line package (DIP), shrink dual in-line package (SDIP), and similar through-hole forms, as shown. The physical dimensions of circuit board 134 are preferably compact to facilitate the installation of monitoring system 100 within a wide range of vehicle applications, both OEM and after-market. Preferably, circuit board 134 comprises an outer dimension of no more than about ¾ inch by 1¾ inch, as *shown*. *Preferably*, positive lead 112, negative lead 114, LED anode wire 138 and LED cathode wire 140 each comprise a single 22 gauge (AWG 22) stranded (7/30) conductor having a maximum voltage capacity of 300 volts. Preferably, protective jacket 136 comprises heat shrink tubing and is applied over circuit board 134 to form a protective sleeve over the circuit assemblies, as shown. Preferably, protective jacket 136 comprises a premium grade PVC. A preferred example heat shrink tubing suitable for use as protective jacket 136 is model FIT-221 produced by Alpha Wire Company of Elizabeth, N.J., U.S.A. (www.alphawire.com).

Figure 4:
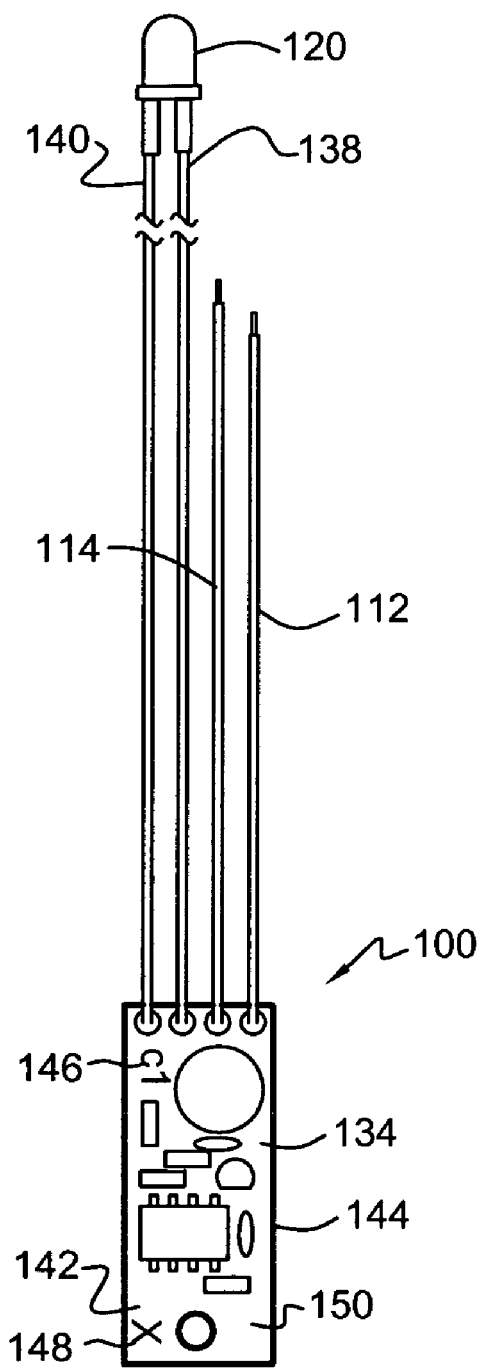
FIG. 4 shows a perspective view of the monitoring system of FIG. 3 with the outer protective jacket removed to permit review of the circuit board.

FIG. 4 is a perspective view of monitoring system 100 with protective jacket 136 removed to permit review of the general assemblies of circuit board 134 according to the preferred embodiment of FIG. 3. Preferably, circuit board 134 is composed of FR4 glass epoxy having a preferred thickness of about 0.062", and a base copper weight of about ½ oz per square inch. Preferably, circuit board 134 comprises two layers of copper circuit traces, one on upper surface 142, and one on lower surface 144, as shown. Preferably, all holes and vias within circuit board 134 are through-plated. Preferably, to assist in the assembly and quality control of monitoring system 100, upper surface 142 of circuit board 134 is preferably screen-printed with component designation indicia 146, as shown. Additionally, screen-printed indicia 148, comprising such secondary information as off-board connections, part numbers, company name and similar labeling are preferably applied to circuit board 134, as shown. Preferably, the above-described screen-printing is applied in a contrasting color, most preferably white. Preferably, upper surface 142 and lower surface 144 are coated with a green solder mask 150 that matches the color of circuit board 134, as shown. Solder mask 150 preferably covers all surfaces of circuit board 134 excepting locations where solder is to be applied. This preferred application of solder mask 150 increases production quality control by preventing solder splash that can cause short circuits. In addition, the applicant has determined that use of solder mask 150 increases the in-service reliability of monitoring system 100 by reducing environmental deterioration of the copper portions of circuit board 134 over time.

Preferably, positive lead 112, negative lead 114, LED anode wire 138 and LED cathode wire 140 each comprise UL Style 1007 wire having a temperature range of −20 degrees C. to +105 degrees C. Preferably, positive lead 112 is red in color. Preferably, negative lead 114 is black. LED anode wire 138 is preferably white, and LED cathode wire 140 is preferably green.

Preferably, LED 120 comprises a T-5 mm case style, as shown. Preferably, LED 120 is a "SUPER RED" producing light in the 660 nm range. Preferably, LED 120 has an effective viewing angle of about 30 degrees. The epoxy lens finish of LED 120 is preferably "WATER CLEAR". A preferred example LED suitable for use as LED 120 is part SSL-LX5093SCR/X produced by Lumex Corporation of Palatine, Ill., U.S.A. (www.lumex.com).

Figure 5:
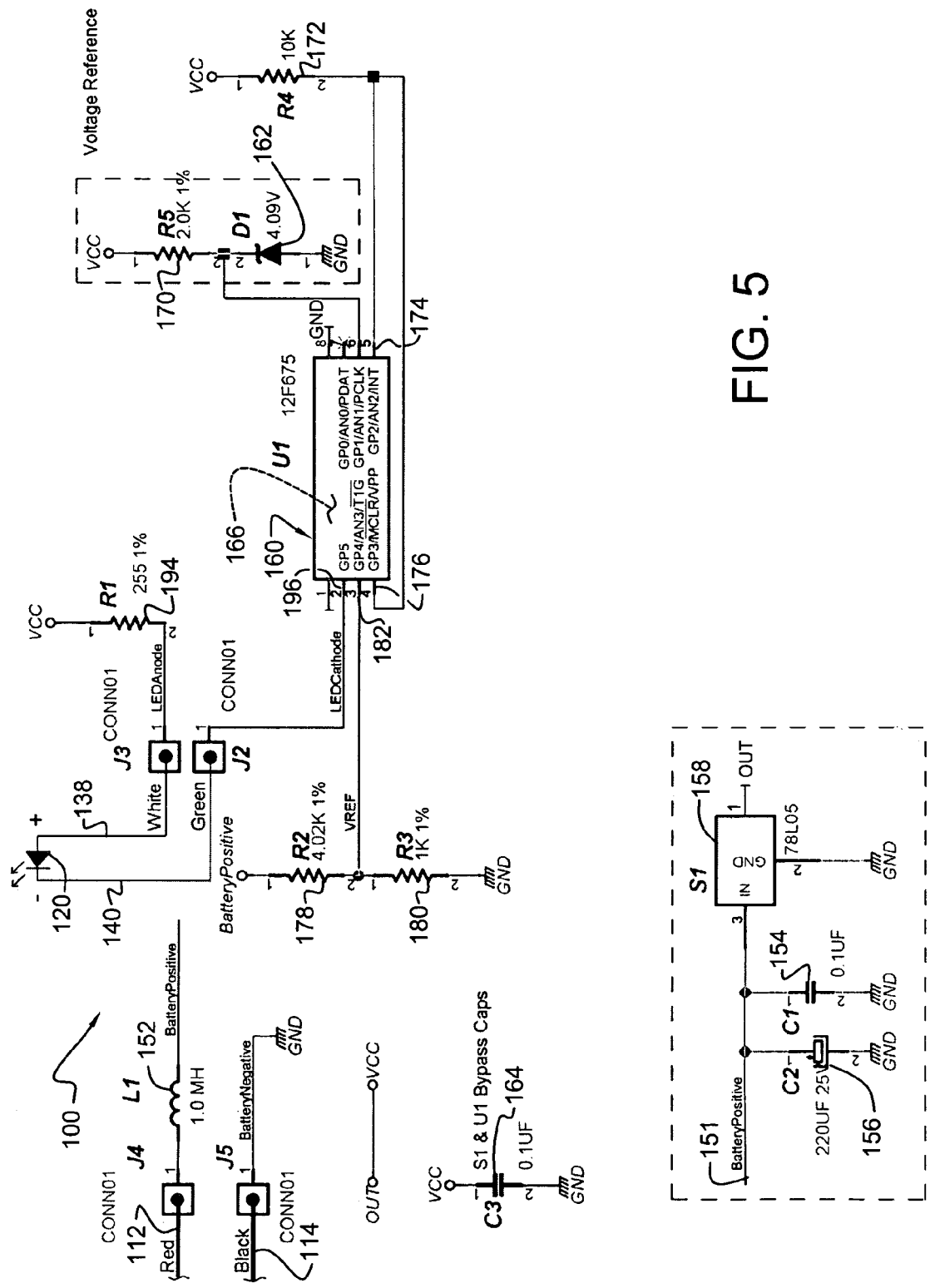
FIG. 5 shows a schematic circuit diagram illustrating the preferred arrangements of electronic components comprising the monitoring system according to the preferred embodiment of FIG. 3.

In reference to FIG. 5, with continued reference to FIG. 1 through FIG. 4, FIG. 5 is a schematic circuit diagram illustrating the preferred arrangements of electronic componentry comprising monitoring system 100, according to the preferred embodiment of FIG. 3.

Preferably, positive lead 112 on circuit board 134 is electrically coupled to electrical system 106 of host vehicle 102 (as shown in the block diagram of FIG. 1). On circuit board 134, sampled voltage from positive lead 112 is passed to RF choke 152 (noted as L1), as shown.

A number of vehicle applications (for example, some Harley Davidson motorcycles) produce levels of RF energy sufficient to cause erratic operation of monitoring system 100. Preferably, RF Choke 152 (at least embodying herein at least one first filter adapted to filter radio frequency energy from the at least one operating voltage) is utilized to condition the incoming current to prevent radio frequency energy produced by host vehicle 102 from entering monitoring system 100, thereby reducing erratic operation related to RF energy. RF choke 152 preferably comprises a 1-millihenry miniature epoxy conformal-coated radio frequency choke. Preferably, choke 152 has a Q of about 50 at 0.79 MHz and a preferred resonant frequency of about 1.6 MHz. RF choke 152 preferably comprises an average DC resistance of about 10 ohms and a maximum current capacity of about 130 mA. A preferred example choke suitable for use as RF choke 152 is the 434-23 series produced by Mouser Electronics of Mansfield, Tex., U.S.A. (www.mouser.com).

Preferably, following RF choke 152 are two filter capacitors. Preferably, first capacitor 154 (C1) is a 0.1 uF ceramic multilayer capacitor rated at 50 volts and is a temperature coefficient type Y5V, as shown. First capacitor 154 preferably functions to filter the high frequency electrical noise on input circuit 151.

Second capacitor 156 (C2) is the second filter capacitor on input circuit 151, as shown. Preferably, second capacitor 156 is a 220-uF aluminum electrolytic capacitor with a 50 volt working range. Preferably, second capacitor 156 has a rated temperature range of about −25 degrees C. to +85 degrees C. Second capacitor 156 preferably functions to filter the low frequency electrical noise from input circuit 151. It should be noted that, in most cases, a 10-microfarad capacitor is acceptable as an input filter capacitor; however, because monitoring system 100 typically operates in a harsh electrical environment (for example, within a motor vehicle), it is often necessary to increase the capacity of the capacitor to 220 microfarads to properly filter the sampled voltage. Preferred example capacitors suitable for use as first capacitor 154 and second capacitor 156 are the Mono-Kap series capacitors produced by Vishay Intertechnology, Inc. of Malvern, Pa., U.S.A. and Aluminum Electrolytic Capacitors Series M type A produced by Panasonic U.S.A. (www.panasonic.com).

After being filtered, the samples voltage is applied to five-volt voltage-regulator 158 (S1), as shown. Preferably, voltage-regulator 158 is a three terminal, fixed voltage, integrated circuit, as shown. Preferably, voltage-regulator 158 has an operating temperature range of 0 degrees C. to +70 degrees C. and can deliver 100 mA of output current. Preferably, voltage-regulator 158 has an output voltage tolerance of about plus or minus 3%. Preferred example voltage-regulators suitable for use as voltage-regulator 158 are the LM140L/LM340L series regulators produced by National Semiconductor Corporation of Santa Clara, Calif., U.S.A. (www.national.com). Preferably, voltage-regulator 158 provides the proper operating voltage to micro-controller 160 (U1), and precision voltage-reference 162 (D1), as shown.

Preferably, circuit board 134 is arranged such that all power, ground, and signal leads are very short, to limit electrical noise and spurious emissions. It should be noted that the preferred layout of circuit board 134 preferably locates micro-controller 160 very close to voltage-regulator 158, thereby permitting the use a single 0.1 microfarad bypass third capacitor 164 (C3), as shown. Preferably, third capacitor 164 is identical to first capacitor 154 and is preferably adapted to bypass unwanted electrical noise to ground. Upon reading the teachings of this specification, those with ordinary skill in the art will now understand that, under appropriate circumstances, considering such issues as specific vehicle application and availability of materials, other less compact circuit board layouts (thereby requiring two bypass capacitors, one for the voltage-regulator, and one for the micro-controller), etc., may suffice.

Preferably, micro-controller 160 comprises an on-board analog-to-digital ("A/D") converter, as shown. Preferably, micro-controller 160 comprises an 8-pin flash-based 8-bit CMOS microcontroller model PIC12F629/675 as produced by Microchip Technology Inc. of Chandler, Ariz., U.S.A. In order to operate, A/D converter 166 (at least embodying herein sample-voltage valuer means, electrically coupled to such sampler means, for providing at least one sampled voltage value for the at least one operating voltage) requires at least one voltage reference source. This voltage-reference is the preferred comparison point from which all of the A/D conversions are made. Further discussion on the operation of A/D converter 166 will be presented in connection with FIG. 6.

Two sources of voltage-reference are available to micro-controller 160. The first voltage-reference source is internal, typically comprising the voltage supplied to micro-controller 160. Within alternate embodiments, this reference voltage may be supplied by voltage-regulator 158. The second and preferred voltage reference source is an externally developed voltage-reference, as described below.

Upon reading the teachings of this specification, those with ordinary skill in the art will now understand that, under appropriate circumstances, considering such issues as availability of highly accurate voltage regulators, etc., other component arrangements, such as the use of an internal voltage reference arrangement to supply the A/D converter, etc., may suffice.

Preferably, all resistors used within monitoring system 100 comprise ¼ watt, 1% tolerance metal film resistors, as shown. Fifth resistor 170 (R5) preferably comprises a 2000-ohm resistor, as shown. Preferably, fifth resistor 170 is electrically coupled to voltage-regulator 158 to provide current for the operation of precision voltage reference 162, as shown. Preferred example resistors suitable for use in the present embodiment the MFR series metal film resistors produced by Yageo Corporation of Plano Tex., U.S.A. (www.yageo.com).

Preferably, precision voltage reference 162 is a precision micropower shunt voltage-reference. A preferred example precision voltage reference voltage-regulator suitable for use as precision voltage reference 162 is the model LM4040 precision voltage reference produced by National Semiconductor Corporation of Santa Clara, Calif., U.S.A. (www.national.com).

Preferably, precision voltage reference 162 produces an output of about 4.096 volts at the junction of precision voltage reference 162 and fifth resistor 170, as shown. Selecting a preferred standard voltage reference of 4.096 volts permits the use of the regulated 5-volts as the supply to precision voltage reference 162, as shown. Using precision voltage reference 162 as the preferred external reference, the overall tolerance of the monitoring system 100 is approximately 0.04 volts (four hundredths of a volt).

In reading the teachings of the following disclosure, it is helpful to recall that there are essentially two conditional states within a digital processor. These two states are preferably identified by several names: logical high and logical low; true and false; yes and no; +5 volts and 0 volts. In general, the functioning of digital devices requires all programming and data to be reduced to this binary format.

Preferably, fourth resister 172 (R4) is a 10,000-ohm resistor, as shown. Fourth resister 172 preferably provides a logical high of about +5 volts to an unused general-purpose input/output pin 174 (GP2) and external micro-controller reset pin 176 (MCLR) located on micro-controller 160, as shown. The preferred action of forcing an input pin into a logical low (zero volts) or logical high (+5 volt) condition ensures stable operation of micro-controller 160. The preferred forcing of MCLR 176 to a logical high condition prevents micro-controller 160 from resetting due to random electrical noise.

Preferably, the voltage applied to the input of A/D converter 166 must not exceed the reference voltage that is developed from precision voltage reference 162 (4.096 volts). Given that the voltage to be sampled from electrical system 106 of host vehicle 102 can vary from a low of 8 or 9 volts to well over 15 volts, it is necessary to scale the sampled voltage to a level that is compatible with micro-controller 160. Preferably, second resistor 178 (R2) and third resistor 180 (R3) are functionally arranged to scale the sampled voltage to a useable level, as shown. Preferably, second resistor 178 is electrically coupled to the battery positive input signal after it has been filtered by first capacitor 154 and second capacitor 156, as shown. Preferably, second resistor 178 is a 4020-ohm resistor with a 1% tolerance. Preferably, third resistor 180 is a 1000-ohm resistor also with a 1% tolerance. Together, second resistor 178 and third resistor 180 forms a voltage divider that scales the vehicle voltage down by a factor of approximately five. Preferably, the scaled voltage (herein after referred to as VREF) taken from the junction of second resistor 178 and third resistor 180 is applied to the A/D input pin 182 (AN3) located on micro-controller 160, as shown.

Figure 6:
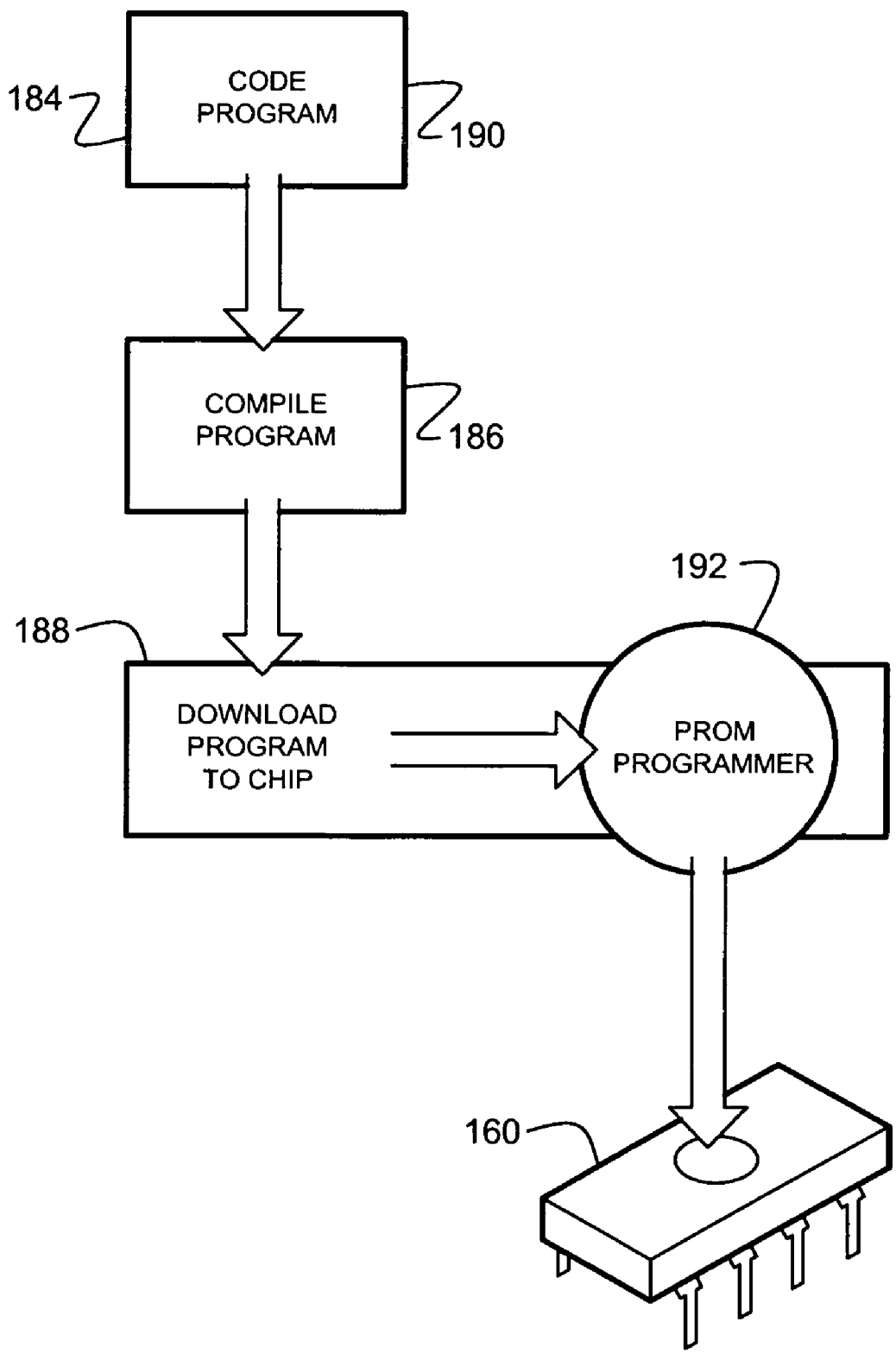
FIG. 6 shows a simplified diagram generally illustrating the preferred steps in programming a micro-controller chip for use within the preferred embodiments of the monitoring system.

FIG. 6 generally illustrates the steps of programming micro-controller 160 for use within monitoring system 100. Preferably, micro-controller 160 comprises an eight-pin, flash-based, 8-bit CMOS micro-controller in a PDIP package. Preferably, micro-controller 160 comprises an 8-pin flash-based 8-bit CMOS microcontroller model PIC12F629/675 as produced by Microchip Technology Inc. of Chandler, Ariz., U.S.A. Preferably, use of a flash based micro-controller permits micro-controller 160 to be reprogrammed repeatedly instead of only once as with a non-flash unit (those skilled in the art will understand the term "Flash" to mean that the memory portion of the device is of an EEPROM type). This preferred feature allows for custom reprogramming of micro-controller 160 as may be required for specific vehicle applications. Preferably, micro-controller 160 contains an internal four MHz oscillator that permits micro-controller 160 to process program instructions at the speed of 4 MHz without the need for an external oscillator. In addition, micro-controller 160 preferably comprises A/D converter 166 as previously described in FIG. 5. Preferably, micro-controller has six input/output pins, as shown. Preferably, micro-controller 160 is capable of directly supplying electrical current to operate LED 120, as illustrated in FIG. 5.

Programming micro-controller 160 to function as desired requires several steps. Preferably, first step 184 comprises coding software control program 190, as shown. Second step 186 preferably comprises compiling and testing control program 190. Third step 188 preferably comprises transferring the compiled version of control program 190 into micro-controller 160, as shown.

The preferred computer language used to develop control program 190 is a subset of the C language called PICC that is designed specifically for the Microchip® series of micro-controllers. Versions of the PICC software are available for a number of computer platforms including Microsoft Windows® based PCs. After control program 190 is written, it is preferably compiled with the PICC compiler, as shown. Preferably, the compiler converts control program 190, written in the PICC language, to the binary code that operates the micro-controller.

Once control program 190 is compiled into a binary file, it is preferably transferred to Device Programmer 192 (also known as a PROM burner or Prom Programmer). Preferably, PROM programmer 192 comprises a unit comparable in specification to a Microchip Pro Mate II Device Programmer with an AC124001 programmer socket installed. To write the compiled version of control program 190 to the chip, microcontroller 160 is mounted in PROM programmer 192 and a command is given for PROM programmer 192 to write the file to the chip. Preferably, PROM programmer 192 erases any previous program that may already be in micro-controller 160 and then writes the new file to the chip. Preferably, PROM programmer 192 then verifies that the program was successfully written to micro-controller 160. On completion of the write procedure, micro-controller is ready for use within monitoring system 100.

Figure 7:
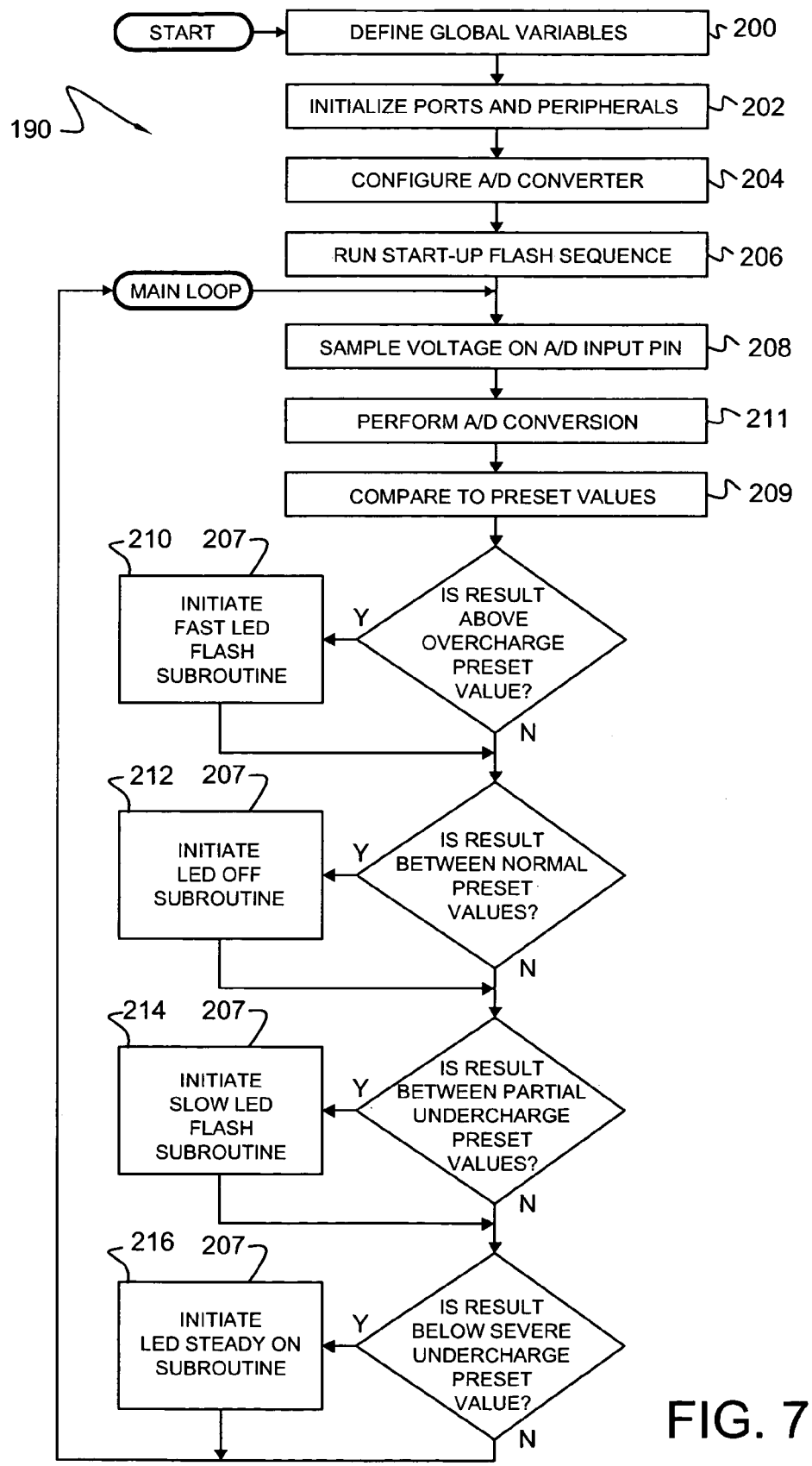
FIG. 7 shows a simplified flow diagram generally illustrating the preferred sequence of programmed steps of the monitoring system control software according to a preferred embodiment of the present invention.

In reference to FIG. 7, with continued reference to the circuit diagram of FIG. 5, FIG. 7 is a simplified flow diagram illustrating the preferred sequence of programmed steps coded within control program 190, according to a preferred embodiment of the present invention. Preferably, control program 190 is written in such a way as to instruct micro-controller 160 to compare a sampled A/D output, temporarily held by micro-controller 160, (at least embodying herein sampled-voltage-value storage means, electrically coupled to such sampler means, for storing the at least one sampled voltage value) against predetermined voltage values stored in memory (at least embodying herein benchmark memory storage means for storing a plurality of programmable benchmark voltage values for the at least one operating voltage) and to flash LED 120 in a defined pattern based on the determined value of the sampled input voltage.

Preferably, the first step executed within control program 190 is variable definition step 200 that defines all global variables subsequently used by control program 190, as shown. Port initialization step 202 preferably initializes the ports and peripherals of micro-controller 160, as shown. The ports are the input and output connections on micro-controller 160. These ports can be used to either send or receive binary information as determined by the software. The peripherals are on-chip hardware functions built into micro-controller 160 (e.g., A/D converter 166).

Within the present preferred embodiment, I/O (input/output) ports 1, 2, 3, and 4 are preferably set as inputs. Preferably, ports 0, 5, and 6 of micro-controller 160 are set as outputs. Preferably, next, A/D converter 166 is configured via two program commands in A/D configuration step 204, as shown.

The preferred procedure to turn on LED 120 is generally described in the following steps. Five volts is applied to first resistor 194 (R1) (see FIG. 5), which preferably comprises a 255-ohm 1% tolerance ¼-watt resistor, as shown. Preferably, the opposite end of first resistor 194 is connected to the anode of LED 120, as shown. The cathode of the LED 120 is preferably connected to output port 196 (GP5) (see FIG. 5) on micro-controller 160, as shown. To turn LED 120 on, a logical low is preferably written to output port 196. This essentially connects output port 196 to ground thereby completing the circuit from first resistor 194 through LED 120 through output port 196 to ground. To turn the LED 120 off, a logical high is preferably written to output port 196. This action opens the circuit ground and LED 120 is turned off.

On completion of A/D configuration step 204, LED 120 is flashed in a short sequence by start-up flash sequence step 206, as shown (the applicant preferably chose to flash the word "hi" in Morse code). Start-up flash sequence step 206 is designed to alert the user to the fact that the unit is on and operating properly.

Preferably, the analog voltage applied to the input of A/D converter 166 is converted to a digital representation by A/D converter 166. A/D converter 166 on micro-controller 160 preferably comprises a 10-bit A/D converter. Recalling from the previous discussion that in a binary representation, there are two states, 0 or 1. Consequently, each data bit can have 2 possible combinations (0 or 1). Ten bits together have two to the tenth power possible combinations (or 1024 in decimal).

The scaled vehicle voltage applied to the input of A/D converter 166 preferably comprises a maximum of 4 volts. The input maximum voltage (4) divided by the number of possible A/D combinations (1024) results in approximately 0.003876 volts per step. That number multiplied by the scale factor (5) provides the actual vehicle volts per step (in the present example, the ratio is about 0.01938 volts per step). It is therefore understood that the digital count approximately equals the vehicle volts divided by 0.01938 (for example, 12 volts divided by 0.01938 equals 619.2). In actual use, the 10-bit number is preferably converted to an 8-bit number. The resulting value for the present example is therefore 154 (i.e., the range and reading are $\frac{1}{4}^{th}$ as large in 8-bit as in 10-bit). Preferably converting to an 8-bit number permits the use of 8 bit arithmetic that processes faster on micro-controller 160 than the equivalent 10 bit numbers.

On completion of flash sequence step 206, control program 190 immediately enters an endless loop, comprising the main body of the program. Preferably, on execution of voltage sample step 208, a command is sent to A/D converter 166 to sample the voltage on the A/D input pin, as shown. Preferably, next, A/D converter 166 converts the sample voltage to an equivalent binary value in A/D conversion step 211, as shown (at least embodying herein sampled-voltage indicator means for providing at least one indication of the at least one sampled voltage value). Preferably, in voltage comparison step 209 (at least embodying herein comparator means for comparing the at least one indication of the at least one sampled voltage value with at least one of the plurality of programmable benchmark voltage values), the binary A/D result is compared to a stored group of preset binary voltage values (numbers) that define the benchmark points for determining when monitoring system 100 should enter a specific LED flash condition and LED control subroutine(s) 207 (at least embodying herein user-sensable signalling device controller means, electrically coupled with such output signaller means, for controlling at least one user-sensable signalling device).

For example, if the result of voltage comparison step 209 is above the preset over charge value (i.e. the LED fast flash condition 124 of FIG. 2), control program 190 preferably initiates fast flash subroutine 210, as shown. Preferably, fast flash subroutine 210 first writes a command to the LED control port that turns LED 120 on (at least embodying herein output signal generator means for generating at least one output signal from such comparator means). The program then preferably enters a delay loop that maintains LED 120 on for a short period. Preferably, when the delay loop finishes, a command is written to the LED control port to turn the LED 120 off. Another delay loop is preferably entered to ensure that the LED will remain off for an appropriate period.

Preferably, if the A/D result is between the preset normal range values, LED off subroutine 212 is initiated, causing a command to be written to the LED control port to turn the LED off, as shown.

If the A/D result is between the preset partial under charge values (i.e. the LED slow flash condition 128 of FIG. 2), control program 190 preferably initiates slow flash subroutine 214, as shown. Preferably, slow flash subroutine 214 comprises subroutine code similar to fast flash subroutine 210; however, the delay loops within slow flash subroutine 214 preferably comprise different timing so that LED 120 will flash slowly.

If the A/D result is below the preset severe under charge values, LED steady on subroutine 216 is preferably initiated and a command is written to the LED control port to turn LED 120 on. After these four actions have completed, the main loop preferably repeats, as shown. Subsequently, a new A/D conversion is commanded and the comparisons preferably repeated. Preferably, the program continues to loop until power is removed from micro-controller 160 (at least embodying herein logic-processor means).

Figure 8:
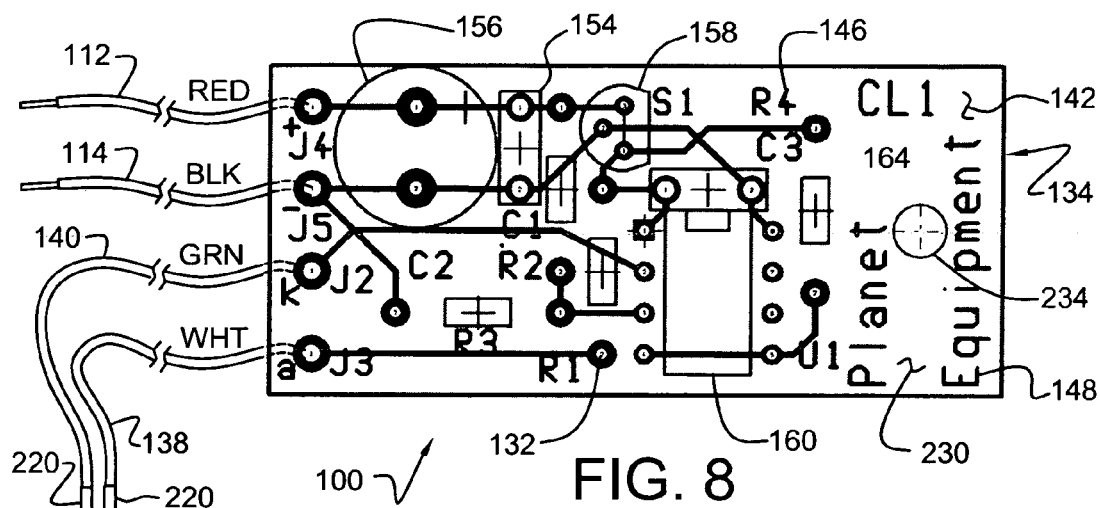
FIG. 8 shows a view of the upper surface of the monitoring system illustrating the preferred configuration of the circuit board and the general steps in assembling the system according to the preferred embodiment of FIG. 4.
Figure 9:
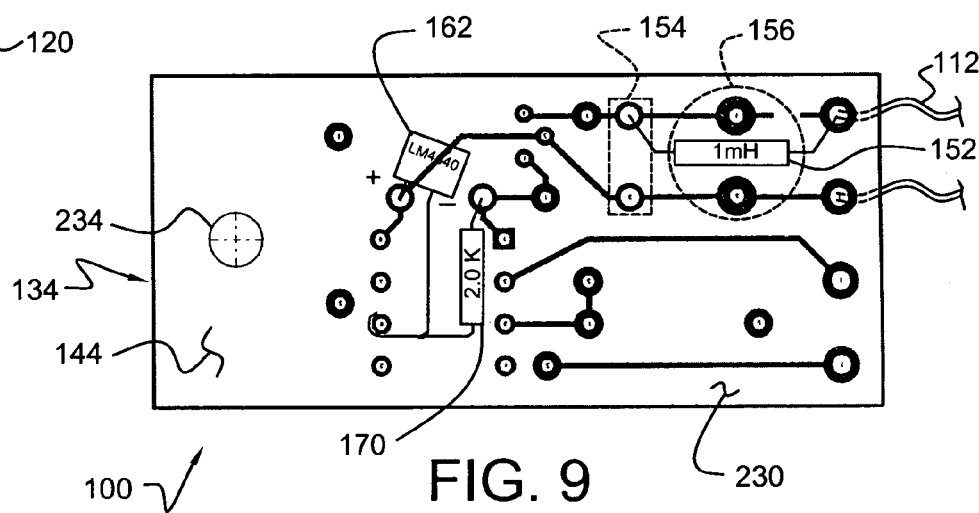
FIG. 9 shows a view of the lower surface of the monitoring system illustrating the preferred configuration of the circuit board according to the preferred embodiment of FIG. 4.

FIG. 8 shows a top view of upper surface 142 of monitoring system 100 illustrating the preferred configuration of the commercial embodiment of circuit board 134 according to the preferred embodiment of FIG. 4. FIG. 9 is a view of lower surface 144 of monitoring system 100 illustrating the preferred configuration of the circuit board according to the preferred embodiment of FIG. 8.

Assembly of monitoring system 100 preferably begins with preparation of positive lead 112, negative lead 114, LED anode wire 138, and LED cathode wire 140. Preferably, one each of a red wire (positive lead 112), black wire (negative lead 114), green wire (LED cathode wire 140), and white wire (LED anode wire 138) is cut to a length of about 9". Preferably, the wire insulation is stripped, preferably about ¼ inch from each wire end, as shown. Preferably, using well-known means, the stripped wire ends are tinned with low residue flux solder that adheres to the IPC ANSI/J-STD-006-A standard (preferably used throughout the assembly). Preferably, one end of LED cathode wire 140 is soldered to the cathode terminal of LED 120 at a distance of about ¼ inch from LED 120, as shown. Preferably, LED anode wire 138 is similarly soldered to the anode lead of LED 120, as shown. Preferably, the leads to LED 120 protruding beyond the solder joint are cut and removed, using means well known to those skilled in the art. Preferably, heat shrink tubing 220 (3/32" diameter by ½ " long) is placed over the solder connections and heated at a temperature of approximately 120 degrees C. Preferably, heat shrink tubing 220 comprises a shrink ratio of 2 to 1, operating temperature of 55 degrees to 135 degrees C., tensile strength of about 1500 psi, longitudinal shrinkage of −5% and dielectric strength of 500 V/mil. Additionally heat shrink tubing 220 preferably passes UL Standard 224 and CSA Standard 198.

The next step in assembly of monitoring system 100 comprises assembling the various components of circuit board 134. Most components are preferably placed on upper surface 142 (component side) of circuit board 134, as shown. Preferably, component leads are formed to extend through mounting hole(s) 132 of circuit board 134, as shown.

It is noted that the circuit trace on lower surface 144 (solder layer) between positive lead 112 (J4) and second capacitor 156 is discontinuous (as a result of the preferred RF filter addition), as shown. Preferably, RF choke 152 is placed on lower surface 144 of circuit board 134 with leads extending up through holes for positive lead 112 (J4) and first capacitor 154, as shown. Preferably, RF choke 152 is soldered when positive lead 112 (J4) and first capacitor 154 is soldered. Preferably, the resistors are then placed on circuit board 134 in their respective positions, as shown. Preferably, the resistor leads are soldered on lower surface 144 (solder layer) of circuit board 134, as shown. Excess lead lengths are preferably cut off using well-known means. Preferably, fifth resistor 170 is placed on lower surface 144 with one lead placed through the hole for third capacitor 164, closest to pin 1 of micro-controller 160. Preferably, the second lead of fifth resistor 170 is formed at a right angle and is connected to pin 6 of micro-controller 160, as shown. Preferably, the third pin (no connect) of precision voltage reference 162 is removed, as shown. Preferably, precision voltage reference 162 is placed on lower surface 144 of circuit board 134, as shown. Preferably, the anode lead of precision voltage reference 162 is inserted through the other hole for third capacitor 164, as shown. Preferably, the cathode lead of precision voltage reference 162 is formed around the lead of fifth resistor 170 that connects to pin 6 of micro-controller 160, as shown. Excess lead lengths are preferably cut off, as shown.

Preferably, micro-controller 160 (U1) is now placed on circuit board 134, as shown. Preferably, each of the eight pins of micro-controller 160 is soldered to circuit board 134, as shown. Preferably, first capacitor 154 and third capacitor 164 are then placed on circuit board 134 and soldered. Next, voltage regulator 158 is inserted and soldered, as shown. After voltage regulator 158 is in place, second capacitor 156 is placed and soldered. Lastly, the red, black, green and white wires are inserted through their respective holes on the board. Preferably, positive lead 112 is soldered to jumper J4, negative lead 114 to jumper J5, LED cathode wire 140 to jumper J2, LED anode wire 138 to jumper J3, as shown. Preferably, all wire leads are soldered on lower surface 144 of circuit board 134, as shown. Throughout the assembly process, excess lead lengths of the wires and components are preferably removed.

The next preferred step is to apply acrylic lacquer conformal coating 230 to circuit board 134. Acrylic lacquer conformal coating 230 protects the assembly from moisture and static electricity. Preferably, conformal coating 230 comprises 419B-340G aerosol produced by MG Chemicals. (www.mgchemicals.com). In addition, acrylic lacquer conformal coating 230 provides a preferred chemical and abrasion resistance. Preferably, three coats of acrylic lacquer conformal coating 230 are applied to circuit board 134 to obtain optimal protection. Preferably, the coating on circuit board 134 is permitted to cure for about 24 hours. The final preferred assembly step is to place a segment of 1½" diameter by 1¾" long heat-shrink tubing over the assembled circuit board 134. Heat-shrink tubing 232 forms a preferred protective sleeve over the assembled circuit board 134 (as illustrated in FIG. 3). Preferably, heat-shrink tubing 232 is essentially identical in specification to heat-shrink tubing 220 described above. Preferably, circuit board mounting hole 234 is left exposed, as shown.

Figure 10A:
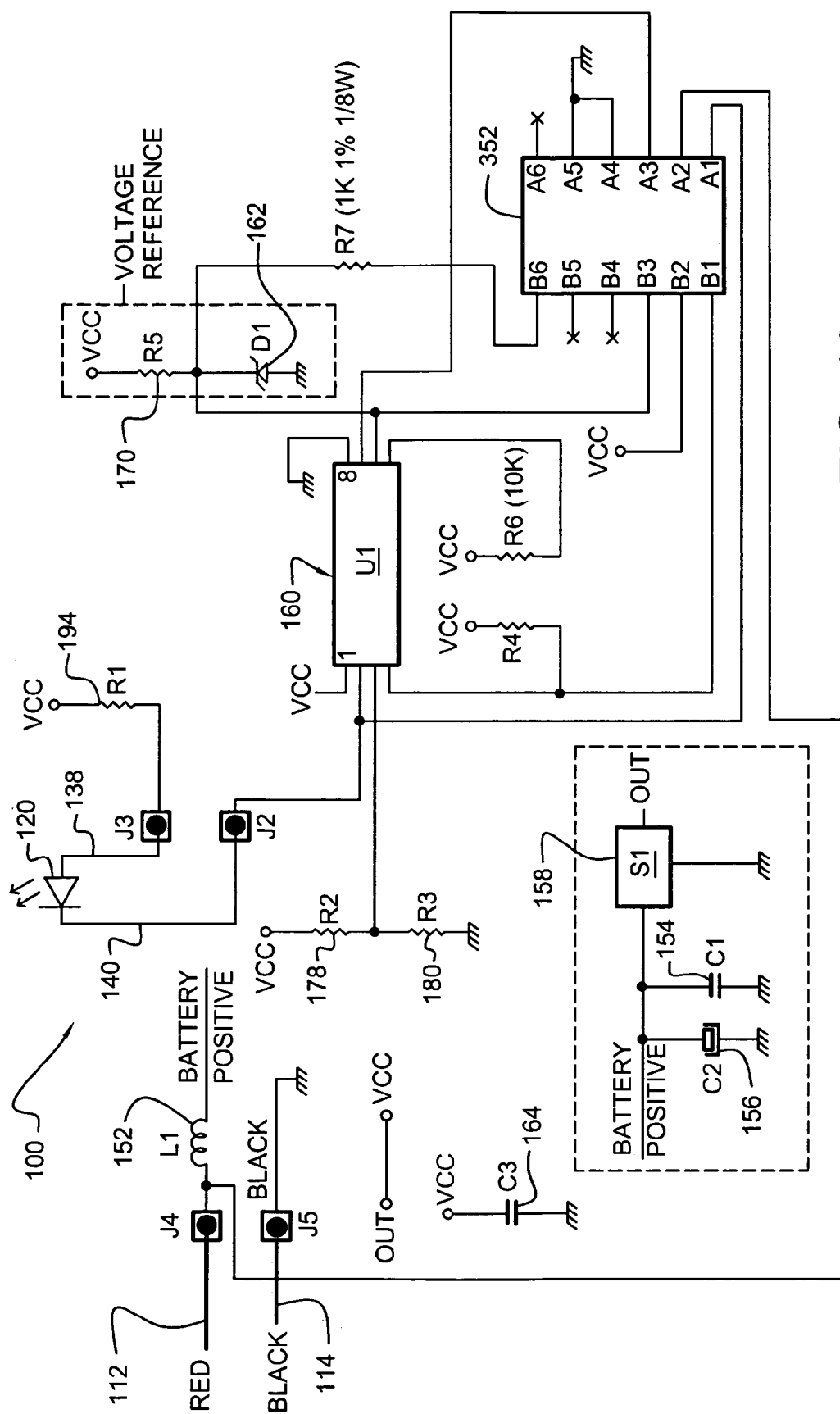
FIG. 10a shows a schematic diagram of the monitoring system comprising surface mounted components, according to an alternate preferred embodiment of the present invention.
Figure 10B:
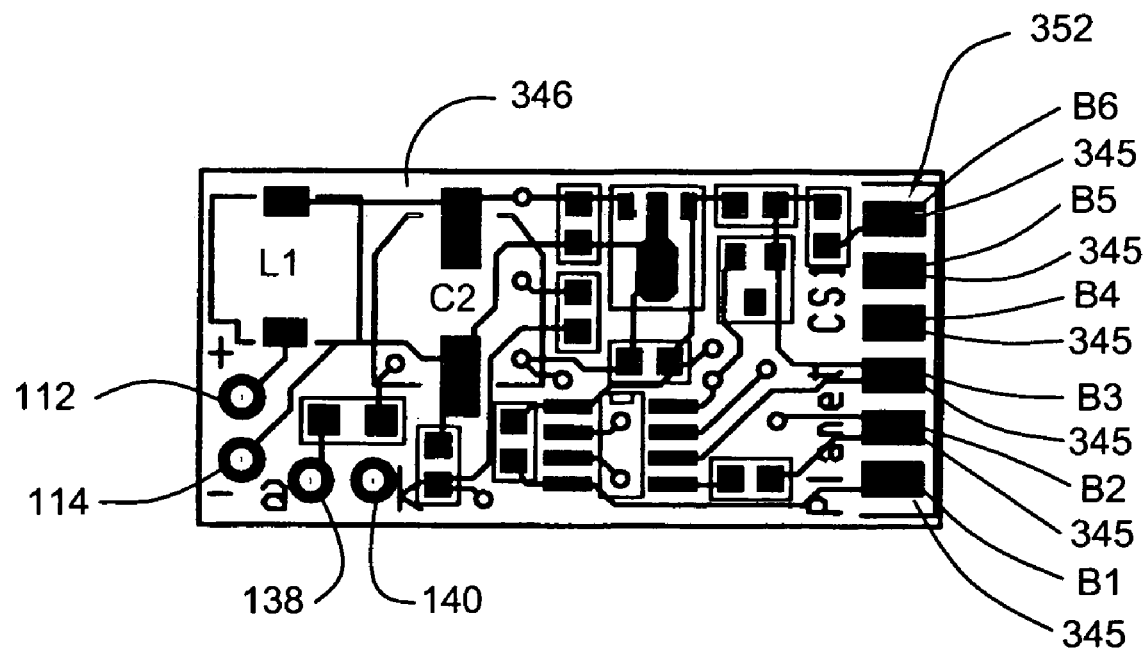
Figure 10C:
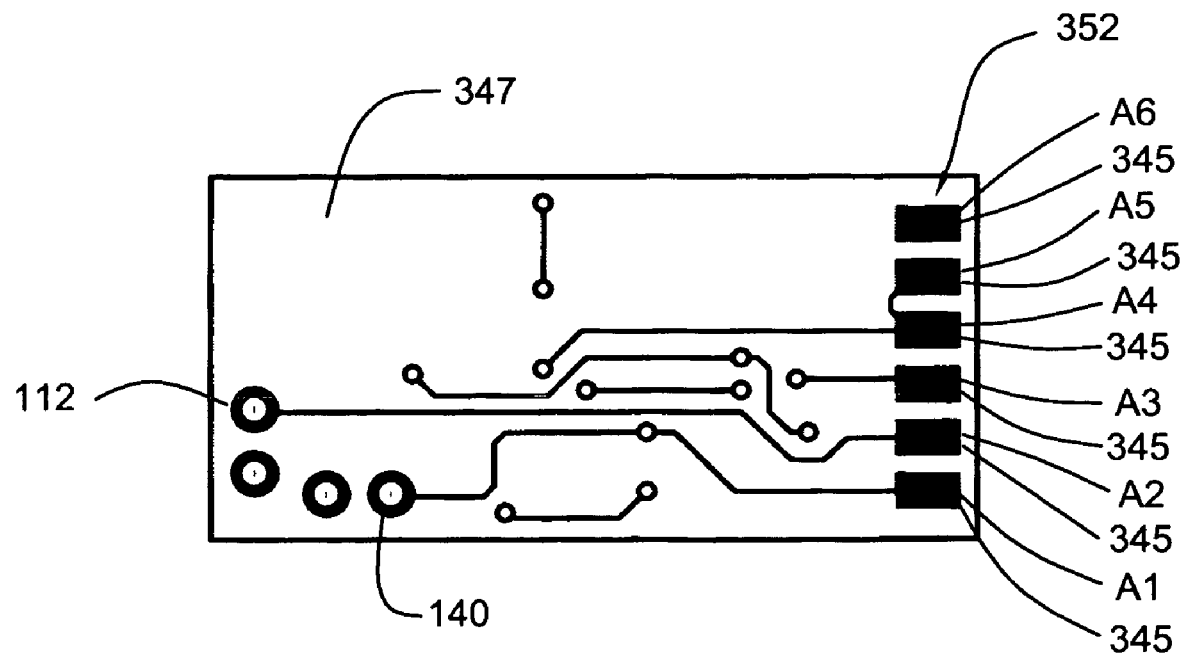
FIG. 10c shows a bottom view of the surface mount board of FIG. 10b.

FIG. 10a shows a schematic diagram of monitoring system 100, comprising surface mounted components, according to an alternate preferred embodiment of the present invention. FIG. 10b shows a top view of surface mount board 350 used to assemble the monitoring system 100 of FIG. 10a. FIG. 10c shows a bottom view of surface mount board 350 of FIG. 10b. Preferably, as illustrated in FIG. 10a, FIG. 10b, and FIG. 10c monitoring system 100 is adaptable to utilize alternate preferred component packaging including; Surface-Mount Technology (SMT), Surface Mount Device (Philips SMD), or Surface Mount Component (SMC) packaging, as shown. Although functionally identical, SMCs are much smaller than through-hole type components and therefore permit the development circuit boards having a smaller size than an equivalent through-hole design. By utilizing surface mounted components, the production of a monitoring device embodiment comprising a relatively compact board size is possible, as shown.

Preferably, the component relationships of surface mount board 350 are essentially identical to those described for the through-hole component embodiment of FIG. 5.

The following table provides a listing of equivalent surface mounted components used in the fabrication of surface mount board 350:

connector 352 permits a single board design to monitor the electrical systems of a wide range of vehicle applications, each having unique monitoring requirements. Further, the preferred use of edge-connector 352 permits all components (including microcontroller) to be pre-assembled on board at time of manufacture, thereby greatly reducing the cost of production. Edge connector 352 (at least embodying herein at least one removably engageable electrical coupling between such at least one circuit and at least one other circuit of at least one other device) is preferably adapted to provide direct programming access to micro-controller 160, as shown. Customization of the operating parameters of monitoring system 100 is therefore possible at any time after component assembly. In addition, each unit can be reprogrammed innumerable times. In some preferred vehicle applications, edge connector 352 can be utilized to couple monitoring system 100 to the vehicle electrical system to be monitored (at least embodying herein at least one removably engageable electrical coupling between such at least one circuit and at least one other circuit of at least one other device, wherein such at least one other device comprises the at least one vehicular electrical charging system)

Figure 11:
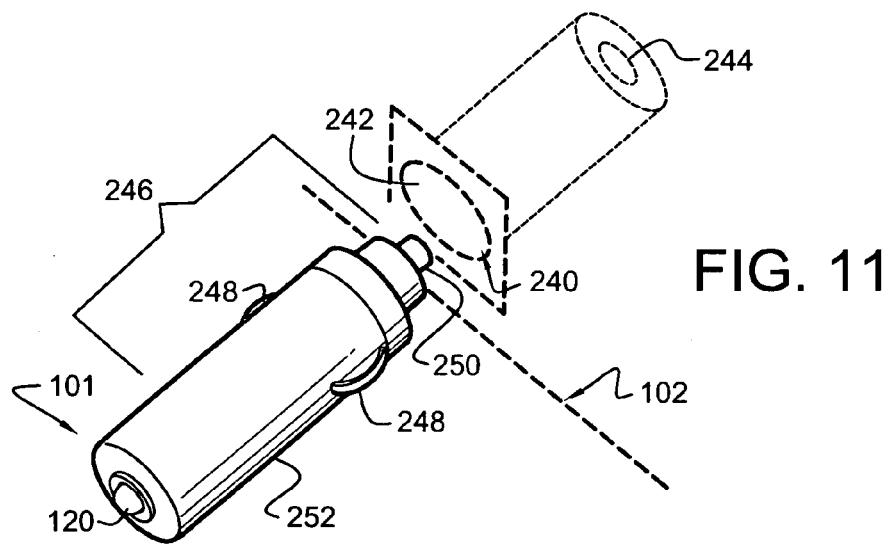
FIG. 11 shows a perspective view illustrating a plug-in monitoring system comprising a vehicular accessory plug-style housing according to an alternate preferred embodiment of the present invention.

FIG. 11 shows a perspective view illustrating plug-in monitoring system 101, comprising a vehicular accessory

| Part | Part No. | Description | Manufacturer |
|---|---|---|---|
| C1 (154) C3 (164) | PCC1828TR-ND | 0.1 UF CERAMIC | PANASONIC |
| R4 (172) R6 | 311-10.0KFTR-ND | 10K 1% ⅛ W | YAGEO |
| R1 (194) | 311-255FTR-ND | 255 1% ¼ W | YAGEO |
| R3 (180) R7 | 311-1.00KFTR-ND | 1.0K 1% ⅛ W | YAGEO |
| R5 (170) | 311-2.00KFTR-ND | 2.0K 1% ⅛ W | YAGEO |
| R2 (178) | 311-4.02KFTR-ND | 4.02K 1% ⅛ W | YAGEO |
| U1 (160) | PIC12F675-I/SN-ND | MICROCONTROLLER | MICROCHIP TECH. |
| C2 (156) | 647-UWT1V221MN1RGS | 220 UF 25 V | NICHICON |
| S1 (158) | 296-11118-2-ND | UA78L05 | TEXAS INSTRUMENTS |
| L1 (152) | 445-1198-1-ND | 1 MH 130 MA CHOKE | TDK |
| D1 (162) | LM4040CIM3-4.1-ND | 4.1 V PRECISION REFERENCE | NATIONAL SEMICONDUCTOR |

In addition, surface mount board 350 (at least embodying herein at least one circuit-supporting substrate) preferably comprises edge-connector 352 located along a peripheral edge (at least embodying herein wherein such at least one circuit-supporting substrate comprises at least one peripheral edge; and such at least one peripheral edge comprises at least one electrical edge-coupler).

The preferred arrangement of edge connector 352 is best illustrated in FIG. 10a and FIG. 10b. Preferably, edge connector 352 permits monitoring system 100 to be plugged into a test/programming fixture for programming (or repeated reprogramming). Preferably, edge connector 352 comprises six conductive contacts 345 located on upper surface 346 and six conductive contacts located on lower surface 347, as shown. Preferably, conductive contacts 345 are electrically coupled, as shown, to the various electronic components of surface mount board 350 (at least embodying herein wherein such at least one edge connector comprises at least one electrically conductive contact electrically coupled to such at least one circuit). The preferred use of edge connector 352 permits monitoring system 100 to be programmed (or reprogrammed) to customer specifications without component replacement. Preferably, the use of edgeplug-style housing, according to an alternate preferred embodiment of the present invention. Preferably, plug-in monitoring system 101 (at least embodying herein wherein such at least one continuous-accessor comprises at least one vehicular accessory power socket adapter to electrically engage at least one vehicular accessory power socket) comprises an essentially cylindrical housing 252 designed to contain circuit board 134 and engage within a standard accessory power socket 240 of host vehicle 102, as shown. A typical accessory power socket 240 (illustrated using dashed lines) consists of a hollow, cylindrically-shaped, grounded contact 242 and a positive supply contact 244, as shown. Preferably, socket-engaging portion 246 of cylindrical housing 252 is adapted such that, when engaged within accessory power socket 240, negative ground terminal(s) 248 contacts and forms an electrical connection with grounded contact 242, as shown. Similarly, positive terminal 250 contacts and forms an electrical connection with positive supply contact 244, as shown. Negative ground terminal(s) 248 are preferably constructed from a resilient spring steel to assist in maintaining an electrical connection with grounded contact 242, as well as to firmly retain socket-engaging portion 246, by friction, within accessory power socket 240, as shown. Plug-in monitoring system 101 has a preferred overall length of about 4", as shown. Preferably, Plug-in monitoring system 101 has a maximum outer diameter designed to allow for smooth insertion and frictional retention within accessory power socket 240 (a standard 12-volt vehicular accessory power socket typically has an interior diameter of about ¾). Upon reading this specification it will be understood by those of skill in the art that, under appropriate circumstances, such as international power socket standards, other applications, etc., other shapes and diameters, such as ½-inch, 10-millimeter, rectangular, etc., may suffice. LED 120 is preferably located to be clearly visible to the operator of the vehicle while Plug-in monitoring system 101 is engaged within accessory power socket 240, as shown.

Figure 12:
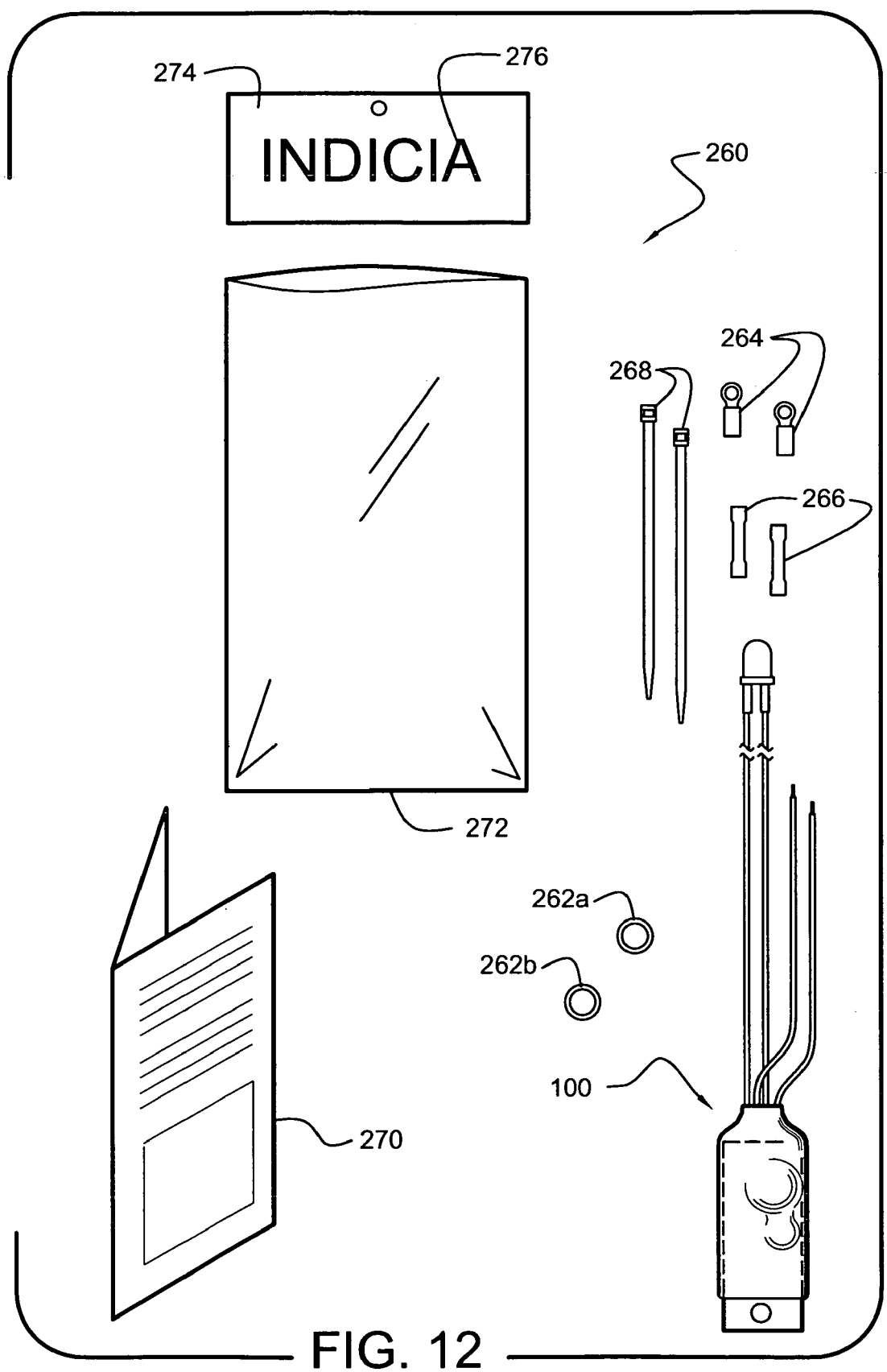
FIG. 12 shows a perspective view illustrating a consumer kit for the commercial distribution of the monitoring system according to another preferred embodiment of the present invention.

FIG. 12 shows a perspective view illustrating a preferred consumer kit 260 for the commercial distribution of monitoring system 100, according to another preferred embodiment of the present invention. Preferably, the following table lists the items that are preferably included in consumer kit 260:

| Quantity | Description |
|---|---|
| 1 each | Monitoring system 100 |
| 1 each | LED socket 262a with retaining ring 262b |
| 2 each | Ring connector 264 (preferably, 16–22ga #6 with vinyl insulating sleeve) |
| 2 each | Butt connector 266 (preferably, 16–22ga with vinyl insulating sleeve) |
| 2 each | Standard 4" black plastic zip cable tie 268 |
| 1 each | Installation and operating instructions 270 |

Preferably, consumer kit 260 is assembled by placing the above listed items in consumer packaging, preferably comprising a 4"×6" reclosable 2-mil poly bag 272, and printed closure card 274, as shown. Preferably, closure card 274 comprises suitable product identifying indicia 276, as shown. Upon reading the teachings of this specification, those with ordinary skill in the art will now understand that, under appropriate circumstances, considering such issues as commercial demand, sales trends, and diversification of product lines, other monitoring system kits, etc., other monitoring system kits, such as a kit containing a plug-in monitor-type system, instructions and packaging, etc., may suffice.

Figure 13:
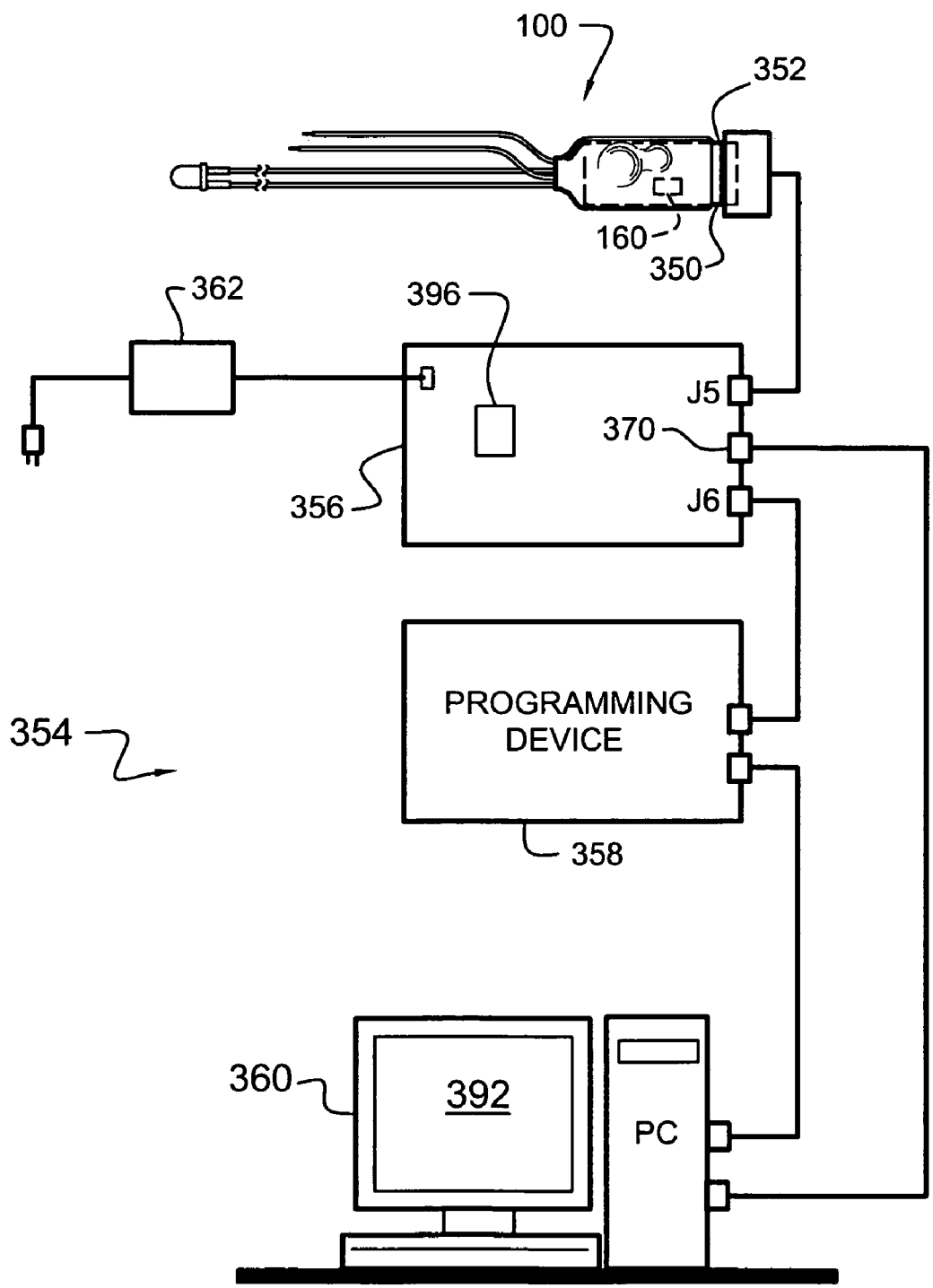
FIG. 13 shows a diagram illustrating edge an edge connector of the monitoring system, coupled to a test/programming fixture, in preparation of component testing and programming of the monitoring system, according to a preferred embodiment of the present invention.

FIG. 13 shows a diagram illustrating edge connector 352 of monitoring system 100, coupled to test/programming fixture 354, in preparation of component testing and programming of surface mount board 350, according to a preferred embodiment of the present invention. The preferred use of edge connector 352 takes beneficial advantage of the data storage feature built into microcontroller 160. Preferably, microcontroller 160 comprises at least one integral EEPROM cell. Typically, information (data) written to this cell remains resident even after power is removed from the unit. Preferably, monitoring system 100 is adapted to access and utilize this information during operation.

Because of component manufacturing tolerances, most electronic components comprise inherent variations in operational performance. For example, a 10,000-ohm resistor with a 1% tolerance (the closest tolerance generally available) can have an actual value of 9900 to 10100 ohms. With a critical circuit, requiring a 10,000-ohm resistor, this tolerance can be excessive. Because most circuits comprise multiple components, the sum of each component tolerance can, together, result in an actual performance varying widely from the designers target performance.

Preferably, monitoring system 100 overcomes these inaccuracies through the use of a novel component calibration method using test/programming fixture 354 (at least embodying herein at least one calibration tester adapted to perform at least one calibration test to measure actual performance of at least one monitoring function of such monitoring system, and at least embodying herein at least one programmer adapted to program such at least one logic-processor). Preferably, monitoring system 100 utilizes calibration hardware and software to test the actual performance of the components of the circuit board. Preferably, the calibration program tests the operating parameters of the particular circuit board components and writes calibration data to the EEPROM cell of micro-controller 160 (at least embodying herein wherein such at least one calibration tester is adapted to produce calibration test data on performing the at least one calibration test). Preferably, this information remains with monitoring system 100 indefinitely unless erased. Preferably, a standard operating program is then loaded into micro-controller 160. The operating program then accesses the calibration data stored in the EEPROM cell and uses it to correct accuracy discrepancies caused by manufacturing/component tolerances. Preferred calibration methods of the present invention are described in greater detail in FIG. 15.

Preferably, test/programming fixture 354 comprises both hardware and software components, as shown. Preferably, hardware components of test/programming fixture 354 include; fixture circuit board 356, programming device 358 and personal computer (hereinafter referred to as PC 360), as shown. Software components of test/programming fixture 354 preferably include at least one program, preferably operating on PC 360.

Figure 14A:
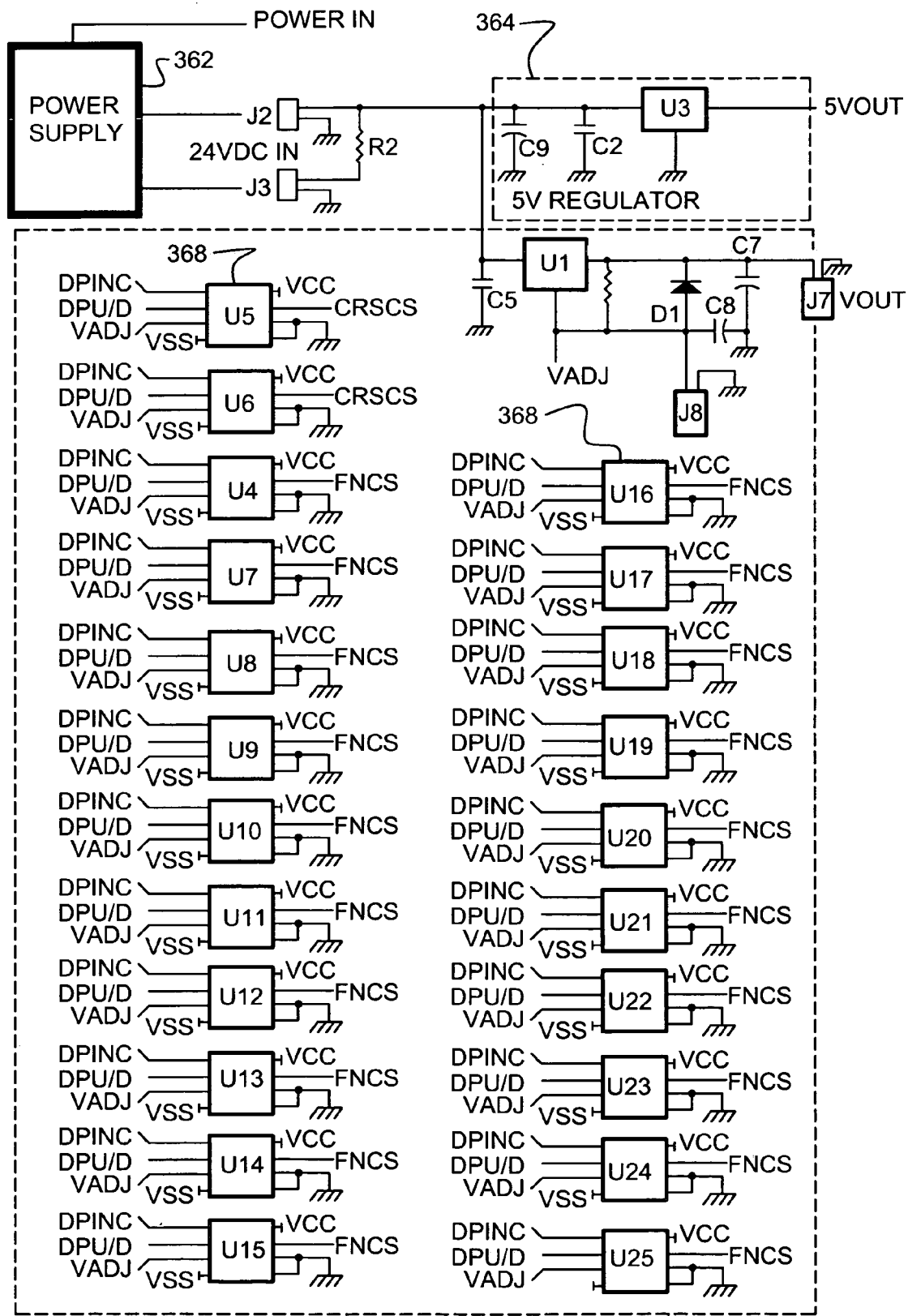
FIG. 14a shows a first portion of a schematic diagram illustrating the circuit arrangements of the test/programming fixture according to a preferred embodiment of the present invention.
Figure 14B:
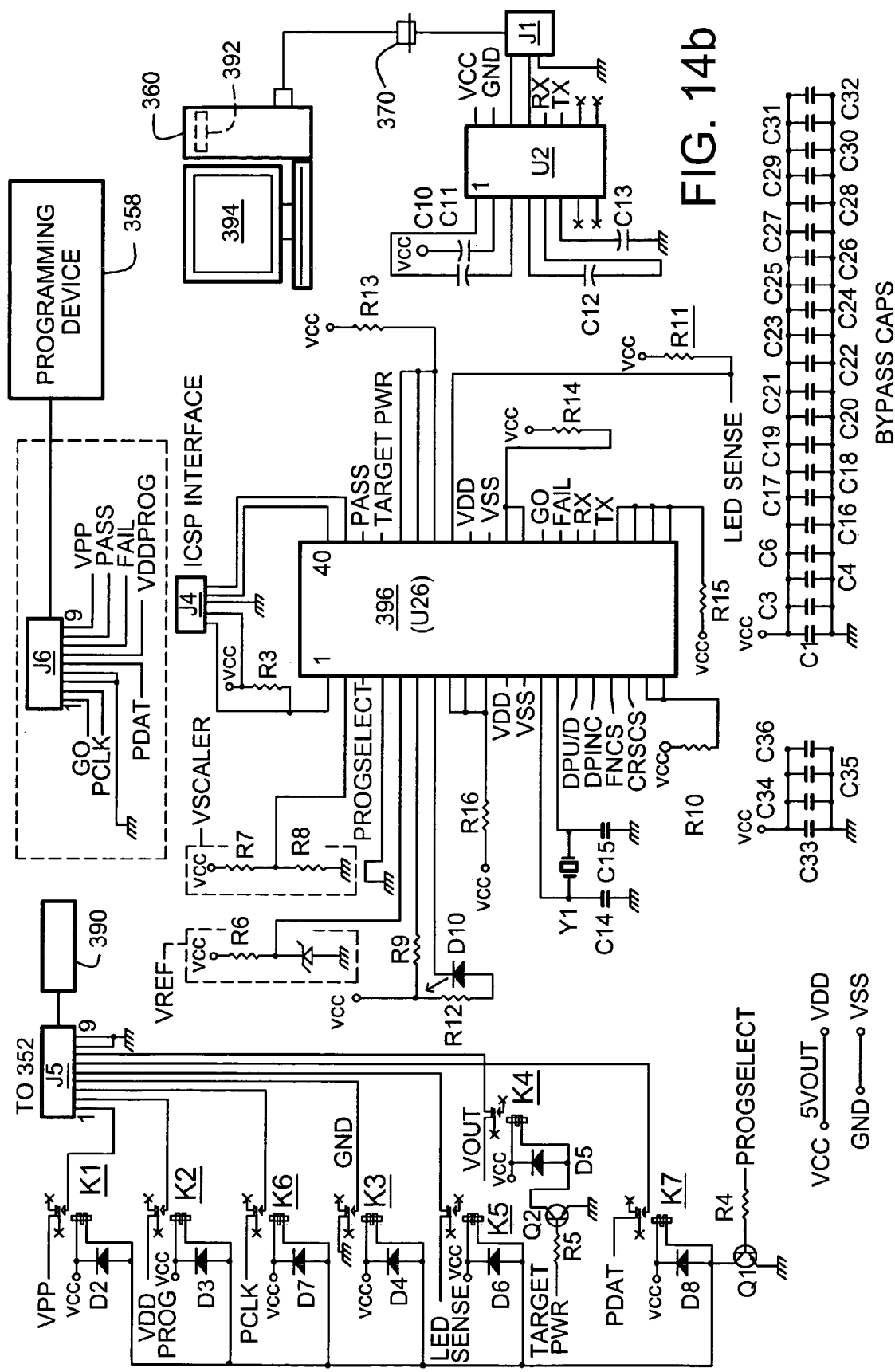

FIG. 14a shows a first portion of a schematic diagram illustrating the circuit arrangements of test/programming fixture 354 according to FIG. 13. FIG. 14b shows a second portion of a schematic diagram illustrating the circuit arrangements of test/programming fixture 354 according to FIG. 14a. Referring to FIG. 13, FIG. 14a and FIG. 14b, preferably, test/programming fixture 354 receives 24 VDC from modular power supply 362 preferably located externally of fixture circuit board 356 (of test/programming fixture 354), as shown. Preferably, 24 VDC power from modular power supply 362 feeds regulated 5 VDC supply 364 and variable voltage supply 366 located on fixture circuit board 356. Preferably, the voltage generated by 5 VDC supply 364 is used to power the various integrated circuits on fixture circuit board 356, as shown. Preferably, variable voltage supply 366 is used during the calibration and testing procedures.

Preferably, variable voltage supply 366 comprises a plurality of digital potentiometers 368, as shown. Preferably, variable voltage supply 366 comprises 22 digital potentiometers identified on FIG. 14a as U5 through U25, as shown. Preferably, U5 and U6 comprise 10,000-ohm digital potentiometers electrically coupled in parallel, as shown. Preferably, U5 and U6, when coupled, comprise a combined value essentially approximating a single 5,000-ohm potentiometer. Preferably, U5 and U6 set the coarse voltage level. Preferably, U4 and U7 through U25 comprise 1,000-ohm digital potentiometers. Preferably, U4 and U7 through U25 are electrically coupled in parallel, as shown. Preferably, the electrically coupled parallel combination of U4 and U7 through U25 approximates a single 50-ohm potentiometer. The coupled arrangement of U4 and U7 through U25 preferably set the fine voltage level.

Preferably, relays K1 through K7 (as best illustrated in FIG. 14*b*) perform signal switching on fixture circuit board 356 as described below.

Preferably, test/programming fixture 354 comprises an embedded fixture microcontroller 396 (U26), as best shown in FIG. 14*b*. Preferably fixture microcontroller 396 comprises a 40-pin, 4 MHz, 8 kB, standard-flash Microcontroller with A/D converter, preferably model PIC16F877-04/P-ND as produced by Microchip Technology Inc. of Chandler, Ariz., U.S.A. Preferably, the circuiting of fixture microcontroller 396 is adapted to control the digital potentiometers and relays of test/programming fixture 354, as shown. Preferably, fixture microcontroller 396 communicates with PC 360 by means of serial port 370 connected to jumper J1, as shown. Preferably, transceiver device U2 functions as an RS-232 communication interface, supporting serial communication operations between test/programming fixture 354 and PC 360, as shown.

Preferred components used in the fabrication of fixture circuit board 356 of test/programming fixture 354 are summarized in the following table:

| Qty | References | Value | Stock No. | Source |
|---|---|---|---|---|
| 27 | C1, C2, C3, C4, C5, C6, C16, C17, C18, C19, C20, C21, C22, C23, C24, C25, C26, C27, C28, C29, C30, C31, C32, C33, C34, C35, C36 | 0.1 UF 50 V | BC1127CT-ND | BC Components Digi-Key |
| 4 | C10, C11, C12, C13 | 0.47 UF 50 V | 493-1098-ND | Nichicon/ Digi-Key |
| 1 | R8 | 1.0K 1% | 1.00KXBK-ND | Digi-Key |
| 1 | C7 | 1.0 UF 50 V | P5174-ND | Panasonic/ Digi-Key |
| 1 | R2 | 1.21K | 1.21KXBK-ND | Digi-Key |
| 8 | R3, R9, R10, R11, R13, R14, R15, R16 | 10K | 10.0KXBK-ND | Digi-Key |
| 2 | C8, C9 | 10 UF 50 V | P5178-ND | Panasonic |
| 1 | U26 (fixture microcontroller 396) | 16F877 | PIC16F877-04/P-ND | Microchip/ Digi-Key |
| 1 | D1 | 1N4007 | 1N4007DICT-ND | Diodes Inc. |
| 7 | D2, D3, D4, D5, D6, D7, D8 | 1N4148 | 1N4148DICT-ND | Diodes Inc. |
| 4 | J2, J3, J7, J8 | 2 Pin | A1921-ND | Digi-Key |
| 1 | R6 | 2.0K 1% | 2.00KXBK-ND | Digi-Key |
| 1 | R7 | 2.1K 1% | 2.10KXBK-ND | Digi-Key |
| 2 | C14, C15 | 22 PF 50 V | BC1005CT-ND | BC Components |
| 1 | R1 | 243 | 243XBK-ND | Digi-Key |
| 1 | R12 | 255 | 255XBK-ND | Digi-Key |
| 2 | Q1, Q2 | 2N2222A | P2N2222AOS-ND | Digi-Key |
| 1 | Y1 | 4.9152 MHZ | CTX050-ND | CTS/Digi-Key |
| 2 | R4, R5 | 499 1% | 499XBK-ND | Digi-Key |
| 1 | D9 | 5.0 VREF | LM4040AIZ-5.0-ND | National Semiconductor/ Digi-Key |
| 1 | U3 | 7805 | LM7805CT-ND | Fairchild Semiconductor |
| 1 | J4 | CONN05 | A19471-ND | Digi-Key |
| 2 | J5, J6 | CONN09 | A19473-ND | Digi-Key |
| 1 | U1 | LM317 | LM317AT-ND | National Semiconductor/ Digi-Key |
| 1 | U2 | MAX202 | MAX202CPE-ND | Maxim/ Digi-Key |
| 1 | D10 | Red LED | 160-1127-ND | Digi-Key |
| 7 | K1, K2, K3, K4, K5, K6, K7 | SPDT | 306-1018-ND | Coto Technology/ Digi-Key |
| 1 | J1 | To DB9 | A19470-ND | Digi-Key |
| 20 | U4, U7, U8, U9, U10, U11, U12, U13, U14, U15, U16, U17, U18, U19, U20, U21, U22, U23, U24, U25 | X9C102P 1K | X9C102P-ND | Xicor/ Digi-Key |
| 2 | U5, U6 | X9C103P 10K | X9C103P-ND | Xicor/ Digi-Key |

Figure 15:
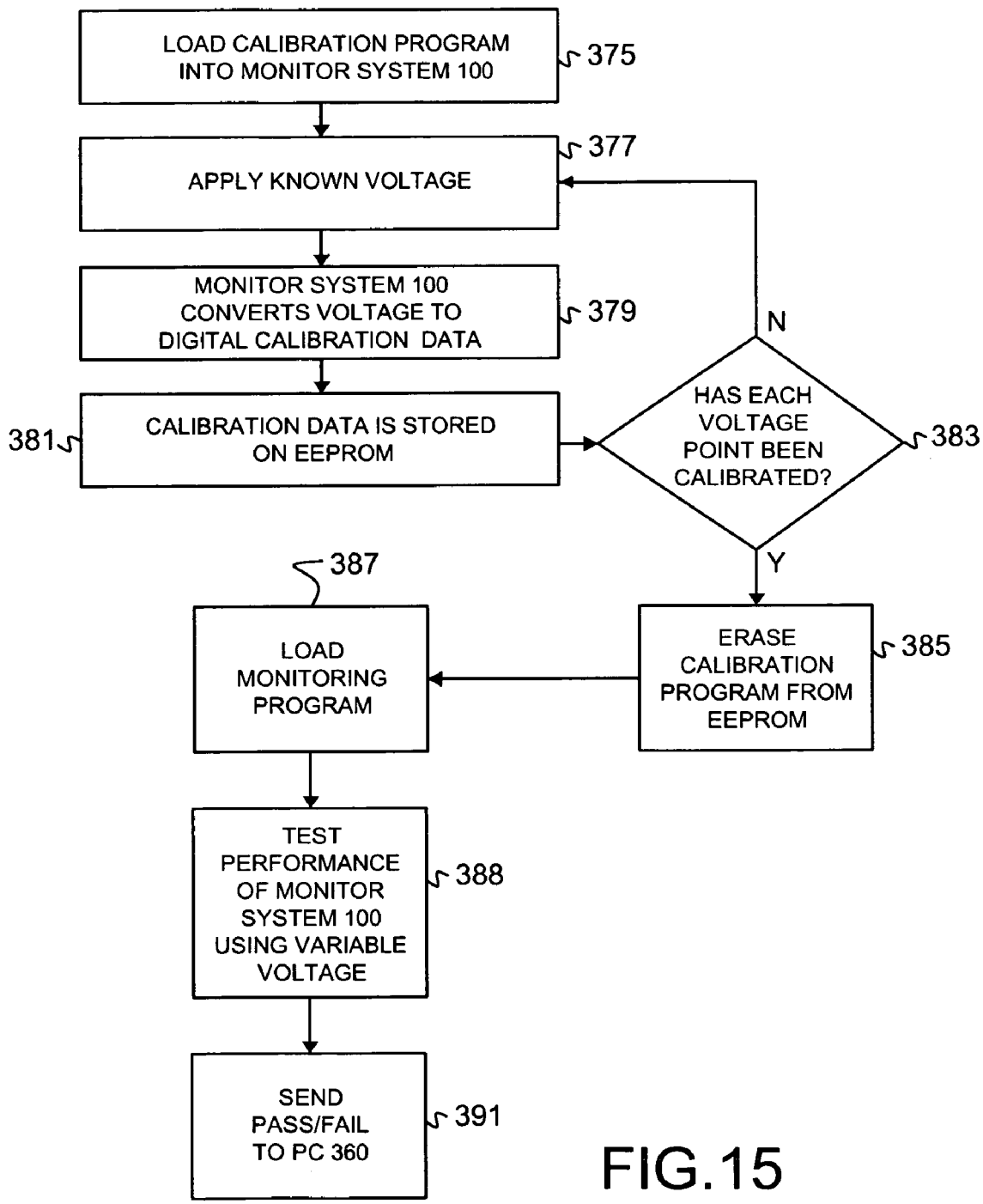
FIG. 15 shows a diagrammatic overview of the preferred procedures employed when calibrating/programming the monitoring system according to preferred methods of the present invention.

FIG. 15 shows a diagrammatic overview of the preferred procedures employed when programming/calibrating monitoring system 100 according to preferred methods of the present invention. Preferably, calibration program 372 is loaded into monitoring system 100 as shown in step 375. Preferably, a known voltage is then applied to the voltage sensing connection of monitoring system 100 as indicated in step 377. Preferably, monitoring system 100 reads the applied voltage and converts it to a digital representation as indicated in step 379. Preferably, calibration program 372, while running on monitoring system 100, stores the digital representation of the known voltage value (hereinafter referred to as calibration data 374) to the EEPROM cell on micro-controller 160 as indicated in step 381. Preferably, steps 377 through 381 are repeated two additional times (one for each remaining voltage level/cut-point that will preferably trigger a specified LED flash pattern), as indicated in step 383.

On completion of step 383, calibration program 100 is erased from monitoring system 100 leaving calibration data 372 intact within the EEPROM cell as indicated in step 385. Preferably, the on-board monitoring program (hereinafter referred to as monitoring program 386) is then loaded into micro-controller 160, as indicated in step 387. Preferably, monitoring program 387 uses calibration data 374 stored within the EEPROM cell on micro-controller 160 as the calibrated voltage and cut-point references.

In subsequent preferred step 388, monitoring system 100 (containing monitoring program 386) is again tested to confirm that the system is functioning within target operational criteria established for the device. Preferably, test/programming fixture 354 is adapted to test monitoring system 100 by measuring the performance of monitoring system 100 under various simulated vehicle voltage conditions. Preferably, test/programming fixture 354 adjusts the voltage levels sampled by monitoring system 100 in preset amounts above and below each of the target voltage conditions. Based on the responses of monitoring system 100, a pass/fail message is sent to PC 360 as indicated in step 391.

Referring now to FIG. 13, FIG. 14a, and FIG. 14b, with continued reference to FIG. 15, the following description provides, in greater detail, the preferred setup and operation of test/programming fixture 354. Preferably, card edge connector 390 is electrically coupled to jumper J5, as shown. Preferably, card edge connector 390 is adapted to accept edge connector 352 of monitoring system 100, for programming and/or testing (as best illustrated in FIG. 13). Preferably, jumper J1 is coupled to serial port 370 that is connected to PC 360 running the Fixture Control Program (hereinafter referred to as FCP 392), as shown. Preferably, jumper J6 is connected to programming device 358, preferably a commercially available unit such as a Pro Mate II Device Programmer available from Microchip Technology Inc. of Chandler, Ariz., USA. Preferably, programming device 358 performs the actual programming of micro-controller 160.

Preferably, prior to programming micro-controller 160, monitoring voltage levels and cutoff points are selected corresponding to the vehicle electrical system to be monitored. Preferably, as a default, FCP 392 is adapted to utilize a standard set of operating parameters for the programming of monitoring system 100. If other application specific cut-points or voltage levels are required, FCP 392 preferably comprises a software user interface to permit the input of non-standard operating parameters using PC 360.

Figure 16:
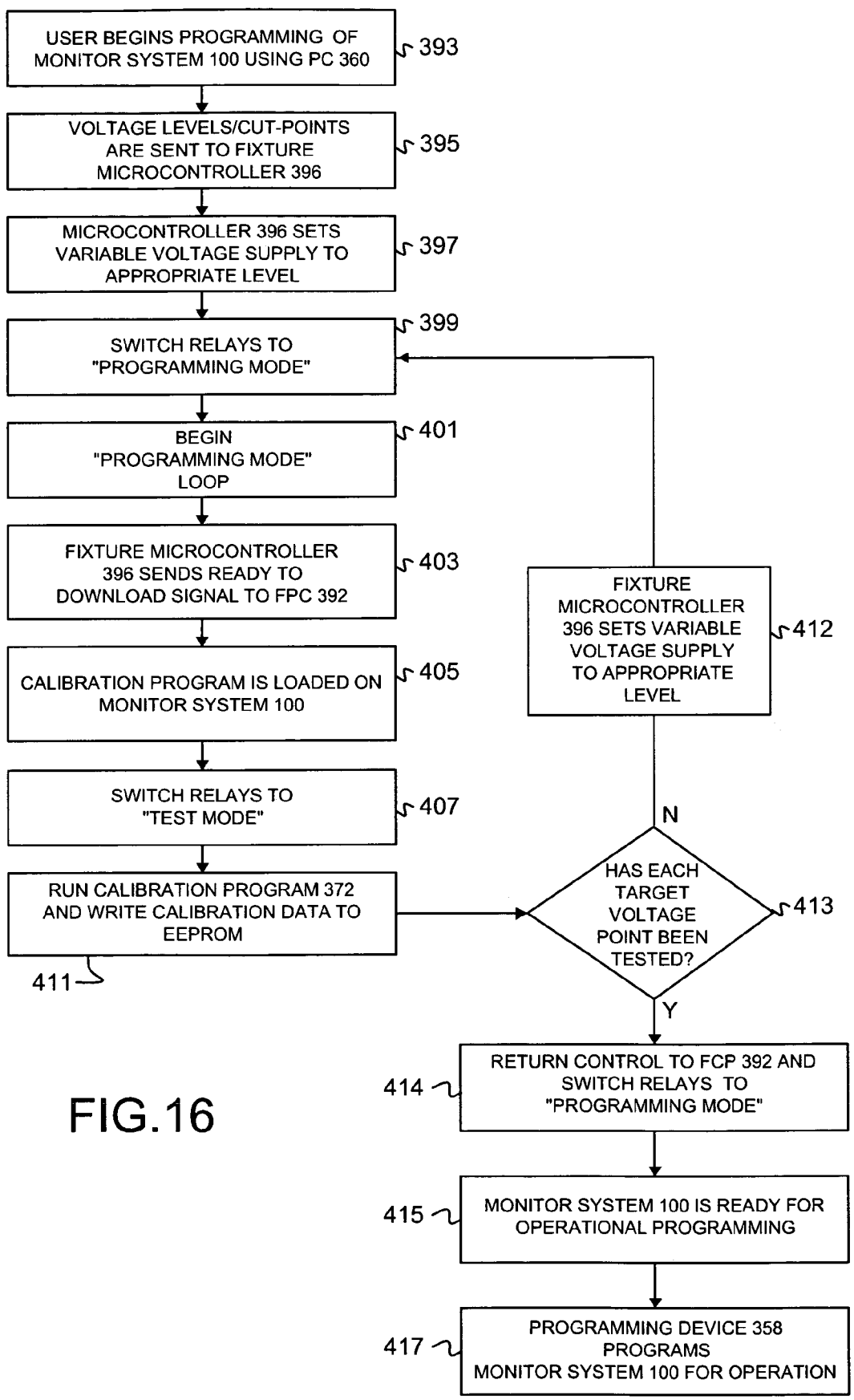
FIG. 16 shows a diagram illustrating the preferred procedures employed when calibrating/programming the monitoring system utilizing a personal computer according to preferred methods of the present invention.

FIG. 16 shows a diagram illustrating the preferred procedures employed when programming monitoring system 100 utilizing PC 360. Referring to FIG. 16 with continued reference to the schematic diagrams of FIG. 14a and FIG. 14b, preferably, a user selects "Program Device" from user interface menu 394 displayed on PC 360, as indicated in step 393. Preferably, FCP 392 sends the default (or modified) voltage levels and/or cut-points to fixture microcontroller 396 (U26). Preferably, fixture microcontroller 396 receives the data and stores it in temporary memory, as indicated in step 395. Preferably, fixture microcontroller 396 then sets the variable voltage regulator to the appropriate level by means of digital signals sent to the digital potentiometers as indicated in step 397.

Preferably, on completion of step 397, fixture microcontroller 396 selectively switches relays K1 through K7 to "programming mode" as indicated in step 399.

In programming mode step 401, the operating voltage for microcontroller 160 is applied to pin B1 of edge connector 352 of monitoring system 100 via relay K1 through pin 1 of jumper J5, as shown. Preferably, programming voltage is received from programming device 358 from pin 6 of jumper J6, as shown. Preferably, this voltage is applied to contact B2 of edge connector 352 via relay K2, and pin 2 of jumper J5, as shown. Preferably, a programming clock signal is received from programming device 358 from pin 2 of jumper J6, as shown. Preferably, this voltage is applied to contact B3 of edge connector 352 via relay K6, and pin 3 of jumper J5, as shown. Preferably, programming ground is applied to contact B4 of edge connector 352 via relay K3 and pin 4 of jumper J5, as shown. Preferably, programming data is received from programming device 358 from pin 5 of jumper J6. Preferably the programming data is applied to contact A3 of edge connector 352 via relay K7, and pin 6 of jumper J5, as shown.

Fixture microcontroller 396 preferably signals to FCP 392 via serial port 370 that calibration program 372 can be loaded, as indicated in step 403.

Preferably, FCP 392 loads calibration program 372 into programming device 358 and commands programming device 358 (at least embodying herein at least one programmer adapted to program such at least one logic-processor) to program monitoring system 100, as indicated in step 405. Preferably, FCP 392 then returns control to test/programming fixture 354. Preferably, test/programming fixture 354 switches the relays to "test mode", as indicated in step 407.

Preferably, while in test mode, the LED-sensing signal from monitoring system 100 is connected to test/programming fixture 354 from contact A1 of edge connector 352 to pin 33 of fixture microcontroller 396 via pin 5 of jumper J5 and relay K5, as shown. Preferably, the fixture variable voltage output is connected to contact A2 of edge connector 352 via relay KB and pin 7 of jumper J5, as shown.

Preferably, once the relays are switched, calibration program 372, previously loaded on fixture microcontroller 396 initializes and runs. Preferably, calibration program 372 reads the voltage level on pin A2 of edge connector 352 (from relay K4), converts it to a digital number, and writes it to the EEPROM cell as indicated in step 411.

Preferably, steps 399 through step 411 are repeated two more times as indicated in by step 413. Preferably, fixture microcontroller directs variable voltage supply 366 to provide the appropriate target cut-point voltage for each loop of step 413 as indicated in step 412.

Preferably, on completion of step 413, control is returned to FCP 392. Preferably, FCP 392 commands test/programming fixture 354 to switch to programming mode as indicated in step 414. Preferably, test/programming fixture 354 advises FCP 392 that monitoring system 100 is ready for programming as indicated in step 415. Preferably, PC 360 loads monitoring program 386 (at least embodying herein wherein such at least one programmer comprises at least one control program adapted to control the logical processing of the at least one sample voltage value) into programming device 358 and commands programming device 358 to program monitoring system 100 as indicated in step 417. Preferably, when monitoring program 386 is loaded into monitoring system 100, control is transferred to test/programming fixture 354 for testing.

Figure 17:
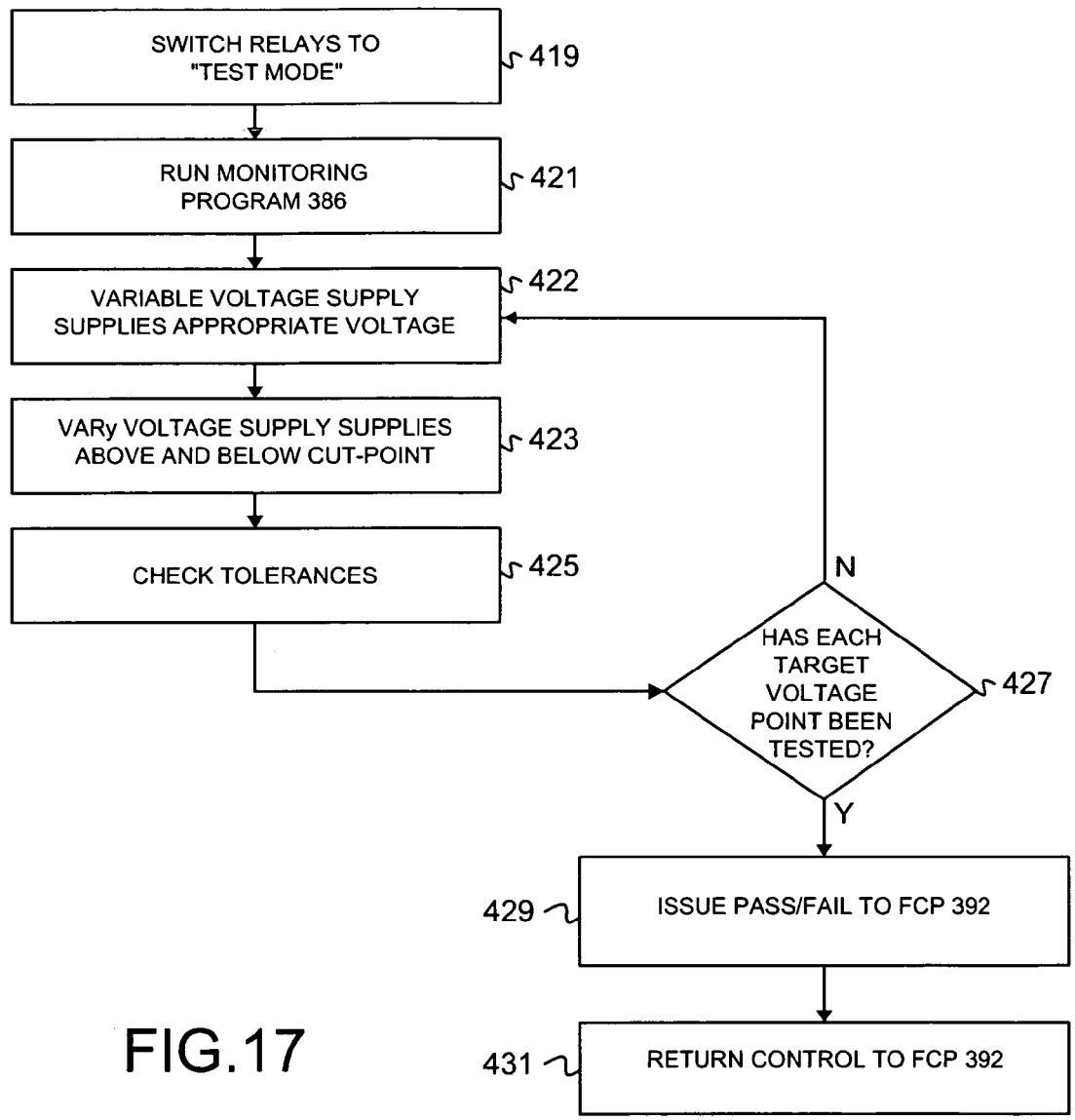
FIG. 17 shows a diagram illustrating the steps by which the operation of the monitoring system is tested according to a preferred method of the present invention.

FIG. 17 shows a diagram illustrating the steps by which the operation of monitoring system 100 is tested according to a preferred method of the present invention. Preferably, fixture microcontroller 396 selectively switches relays K1 through K7 to "test mode" as indicated in step 419. Preferably, once the relays are switched, monitoring program 386 initializes and runs as indicated in step 421. Preferably, monitoring program 386 reads the voltage level on contact A2 of edge connector 352 (from relay K4), and compares the voltage level to the digital numbers of calibration data 374 previously stored in the EEPROM cell and operates the circuitry controlling LED 120 as per program requirements (at least embodying herein wherein such at least one control program comprises at least one calibrator adapted to calibrate the monitoring performance of such monitoring system to match at least one target monitoring performance; and such at least one calibrator calibrates the operational performance of such monitoring system by utilizing the at least one set of calibration test data). Preferably, the circuitry controlling LED 120 is accessed at pin A1 of edge connector 352. Preferably, pin A1 is accessed by pin 33 of fixture microcontroller 396, via pin 5 of jumper J5 and relay K5. Preferably, as indicated in step 422, fixture microcontroller 396 directs variable voltage supply 366 to supply the appropriate cut-point voltage. Preferably, fixture microcontroller 396 then varies the voltage a certain amount above and below the cut-point as indicated in step 423. Based on the supplied voltage and circuitry status at LED 120, fixture microcontroller 396 determines if the operation of monitoring system 100 is within acceptable tolerances as indicated in step 425.

Preferably, in step 427, steps 422 through 425 are repeated for each voltage cut-point. Preferably, fixture microcontroller 396 issues a pass/fail message that is sent with the pass/fail parameters to FCP 392 as indicated in step 429. In final testing step 431, control is returned to FCP 392.

Thus, in accordance with preferred embodiments of the present invention, there is provided, relating to vehicle monitoring systems, a method of calibrating such monitoring systems, comprising steps of: ascertaining at least one baseline operational characteristic of such vehicular voltage monitoring system by operational testing of such voltage monitoring system; selecting at least one target operational characteristic of such vehicular voltage monitoring system; and adjusting such at least one baseline operational characteristic of such vehicular voltage monitoring system to match such at least one target operational characteristic; wherein such adjusting at least includes altering at least one value of at least one software program operating in conjunction with such vehicular voltage monitoring system.

Figure 18:
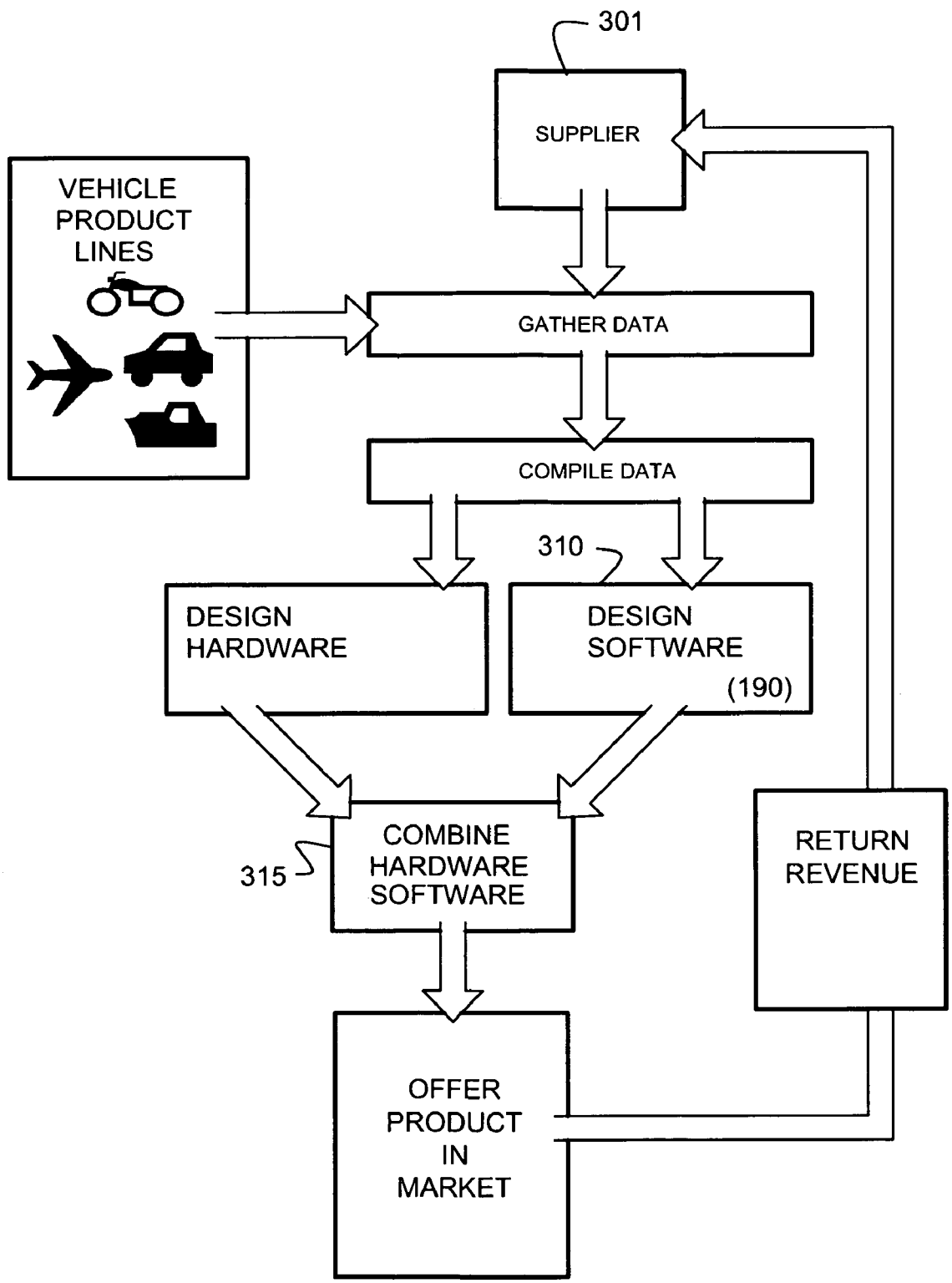
FIG. 18 shows a simplified diagram illustrating a supplier's overall business method for designing, manufacturing and selling a vehicle-specific voltage monitoring system.

FIG. 18 shows a simplified diagram illustrating a supplier's overall business method for designing, manufacturing and selling a vehicle-specific voltage monitoring system. According to a preferred embodiment of the present invention, supplier 301 preferably gathers information regarding introductions of new models of vehicles by the vehicle manufacturers. Preferably, each new vehicle product introduction is analyzed to determine the vehicle's typical electrical system voltage characteristics. Typically, supplier 301 performs research, by direct system testing and, under appropriate circumstances, by review of manufacturer's available specification data. Preferably, once the data is compiled for each vehicle voltage system, the data is used to make necessary code changes in new/existing control software 310. Preferably, these changes may include vehicle-specific adjustments to the benchmark voltage values used by an in-vehicle monitoring system.

Preferably, supplier 301 designs an in-vehicle hardware device, such as monitoring system 100, to sample a vehicle's electrical system voltage and compare the sampled voltage against the benchmark voltage values. Preferably, supplier 301 arranges for manufacture of the hardware devices and installation of the control software 310. Finally, supplier 301 offers the combined hardware/software product 315 for sale in the market, as shown. Preferably, hardware/software product 315 may be supplied as an OEM product or aftermarket kit.

Although applicant has described applicant's preferred embodiments of this invention, it will be understood that the broadest scope of this invention includes such modifications as diverse shapes and sizes and materials. Such scope is limited only by the below claims as read in connection with the above specification. For example, upon reading the teachings of this specification, those with ordinary skill in the art will now understand that, under appropriate circumstances, considering issues such as, advances in technology, intended application, etc., the use of the disclosed monitoring system with other electrical systems, such as, for example, any electrical system having a variable operating voltage, etc., may suffice.

Further, many other advantages of applicant's invention will be apparent to those skilled in the art from the above descriptions and the below claims.

What is claimed is:

1. A monitoring system, relating to monitoring of at least one electrical system having at least one current-carrying circuit, such circuit comprising at least one variable operating voltage, such system comprising:
   a) continuous-accessor means for continuously accessing the at least one variable operating voltage of the at least one current-carrying circuit;
   b) sampler means, electrically coupled to said continuous-accessor means, for sampling the at least one variable operating voltage;
   c) sample-voltage valuer means, electrically coupled to said sampler means, for providing at least one sampled voltage value for the at least one variable operating voltage;
   d) benchmark memory storage means for storing a plurality of programmable benchmark voltage values for the at least one variable operating voltage;
   e) sampled-voltage-value storage means, electrically coupled to said sampler means, for storing the at least one sampled voltage value;
   f) logic-processor means, electrically coupled to said benchmark memory storage means and said sampled-voltage-value storage means, for logically processing the at least one sampled voltage value, wherein said logic-processor means comprises
      i) sampled-voltage indicator means for providing at least one indication of the at least one sampled voltage value,
      ii) comparator means for comparing the at least one indication of the at least one sampled voltage value with at least one of the plurality of programmable benchmark voltage values, and iii) output signal generator means for generating at least one output signal from said comparator means; and g) user-sensable signalling device controller means, electrically coupled with said output signal generator means, for controlling at least one user-sensable signalling device.

2. A monitoring system, relating to vehicle-user monitoring of at least one vehicular electrical charging system having at least one current-carrying circuit, such circuit comprising at least one operating voltage and at least one rechargeable energy storage battery, such system comprising:

a) at least one continuous-accessor adapted to continuously access the at least one operating voltage of the at least one current-carrying circuit;

b) at least one sampler, electrically coupled to said at least one continuous-accessor, adapted to sample the at least one operating voltage;

c) at least one sample-voltage valuer, electrically coupled to said at least one sampler, structured and arranged to provide at least one sampled voltage value for the at least one operating voltage;

d) at least one benchmark memory storage to store a plurality of programmable benchmark voltage values for the at least one operating voltage;

e) at least one sampled-voltage-value storage, electrically coupled to said at least one sampler, to store the at least one sampled voltage value;

f) at least one logic-processor, electrically coupled to said at least one benchmark memory storage and said at least one sampled-voltage-value storage, for logically processing the at least one sampled voltage value, wherein said at least one logic-processor comprises i) at least one sampled-voltage indicator structured and arranged to provide at least one indication of the at least one sampled voltage value, ii) at least one comparator to compare the at least one indication of the at least one sampled voltage value with at least one of the plurality of programmable benchmark voltage values, and iii) at least one output signal generator to generate at least one output signal from said at least one comparator; and g) at least one user-sensable signaling-device controller, electrically coupled with said at least one output signal generator, structured and arranged to control at least one user-sensable signalling device.

3. The monitoring system according to claim 2 further comprising at least one user-sensable signalling device, coupled to said at least one output signal generator, structured and arranged to provide at least one user-sensable signal.

4. The monitoring system according to claim 3 wherein said at least one user-sensable signalling device is adapted to provide at least four unique user-sensable signals.

5. The monitoring system according to claim 3 wherein said at least one user-sensable signalling device comprises a single illumination source.

6. The monitoring system according to claim 2 wherein said at least one logic-processor is programmable.

7. The monitoring system according to claim 2 wherein said at least one logic-processor comprises electrically erasable, programmable read-only memory.

8. The monitoring system according to claim 2 wherein said at least one sample-voltage valuer comprises at least one analog-to-digital converter structured and arranged to convert the at least one operating voltage from at least one analog signal to at least one digital value.

9. The monitoring system according to claim 2 wherein said at least one continuous-accessor is adapted to sample the at least one operating voltage of exactly one of the at least one current-carrying circuits.

10. The monitoring system according to claim 2 wherein said at least one sampler comprises at least one circuit structured and arranged to electrically process the at least one operating voltage.

11. The monitoring system according to claim 10 further comprising:

a) at least one calibration tester adapted to perform at least one calibration test to measure actual performance of at least one monitoring function of said monitoring system;

b) wherein said at least one calibration tester is adapted to produce calibration test data on performing the at least one calibration test.

12. The monitoring system according to claim 11 further comprising at least one programmer adapted to program said at least one logic-processor.

13. The monitoring system according to claim 12 wherein said at least one programmer comprises at least one control program adapted to control the logical processing of the at least one sampled voltage value.

14. The monitoring system according to claim 13 wherein:

a) said at least one control program comprises at least one calibrator adapted to calibrate the monitoring performance of said monitoring system to match at least one target monitoring performance; and b) said at least one calibrator calibrates the operational performance of said monitoring system by utilizing the at least one set of calibration test data.

15. The monitoring system according to claim 13 further comprising:

a) at least one circuit-supporting substrate adapted to support said at least one circuit;

b) wherein said at least one circuit-supporting substrate comprises at least one peripheral edge; and c) said at least one peripheral edge comprises at least one electrical edge-coupler adapted to permit at least one removably engageable electrical coupling between said at least one circuit and at least one other circuit of at least one other device.

16. The monitoring system according to claim 15 wherein said at least one other device comprises said at least one calibration tester.

17. The monitoring system according to claim 15 wherein said at least one other device comprises said at least one programmer.

18. The monitoring system according to claim 15 wherein said at least one other device comprises the at least one vehicular electrical charging system.

19. The monitoring system according to claim 13 wherein said at least one calibration tester comprises said at least one programmer.

20. The monitoring system according to claim 15 wherein said at least one edge connector comprises at least one electrically conductive contact electrically coupled to said at least one circuit.

21. The monitoring system according to claim 20 wherein said at least one edge connector comprises:

a) at least one electrically conductive data contact adapted to conduct at least one data signal to at least one data-using component of said monitoring system; and
b) at least one electrically conductive power contact adapted to conduct electrical power to said at least one circuit.

22. The monitoring system according to claim 10 wherein said at least one circuit comprises at least one first filter adapted to filter radio frequency energy from the at least one operating voltage.

23. The monitoring system according to claim 22 wherein said at least one circuit further comprises:
a) at least one second filter adapted to filter out conducted high frequency noise from the at least one operating voltage; and
b) at least one third filter adapted to filter out conducted low frequency noise from the at least one operating voltage.

24. The monitoring system according to claim 2 wherein said at least one continuous-accessor requires only one positive electrical connection and only one grounded connection to the at least one current-carrying circuit.

25. The monitoring system according to claim 2 wherein said at least one continuous-accessor comprises at least one vehicular accessory power socket adapter to electrically engage at least one vehicular accessory power socket.

26. The monitoring system according to claim 25 wherein:
a) said at least one vehicular accessory power socket adapter comprises at least one cylindrical housing; and
b) said at least one cylindrical housing comprises at least one interior cavity portion adapted to essentially contain said monitoring system.

27. A monitoring system, relating to vehicle-user monitoring of at least one vehicular electrical charging system having at least one current-carrying circuit, such circuit comprising at least one operating voltage, at least one rechargeable energy storage battery and at least one accessory power socket, such system comprising:
a) at least one continuous-accessor adapted to continuously access the at least one operating voltage of the at least one current-carrying circuit by engaging the at least one accessory power socket;
b) at least one sampler, electrically coupled to said at least one continuous-accessor, adapted to sample the at least one operating voltage;
c) at least one sample-voltage valuer, electrically coupled to said at least one sampler, structured and arranged to provide at least one sampled voltage value for the at least one operating voltage;
d) at least one benchmark memory storage to store a plurality of programmable benchmark voltage values for the at least one operating voltage;
e) at least one sampled-voltage-value storage, electrically coupled to said at least one sampler, to store the at least one sampled voltage value;
f) at least one logic-processor, electrically coupled to said at least one benchmark memory storage and said at least one sampled-voltage-value storage, for logically processing the at least one sampled voltage value, wherein said at least one logic-processor comprises
i) at least one sampled-voltage indicator structured and arranged to provide at least one indication of the at least one sampled voltage value,
ii) at least one comparator to compare the at least one indication of the at least one sampled voltage value with at least one of the plurality of programmable benchmark voltage values, and
iii) at least one output signal generator to generate at least one output signal from said at least one comparator; and
iv) at least one user-sensable signalling device controller, electrically coupled with said at least one output signal generator, structured and arranged to control at least one user-sensable signalling device.

28. A kit system, containing at least one monitoring device for monitoring at least one vehicular electrical charging system, such kit system comprising:
a) at least one continuous-accessor adapted to continuously access at least one operating voltage of the at least one current-carrying circuit by engaging the at least one accessory power socket;
b) at least one sampler, electrically coupled to said at least one continuous-accessor, adapted to sample the at least one operating voltage;
c) at least one sample-voltage valuer, electrically coupled to said sampler means, structured and arranged to provide at least one sampled voltage value for the at least one operating voltage;
d) at least one benchmark memory storage to store a plurality of programmable benchmark voltage values for the at least one operating voltage;
e) at least one sampled-voltage-value storage, electrically coupled to said at least one sampling means, to store the at least one sampled voltage value;
f) at least one logic-processor, electrically coupled to said at least one benchmark memory storage and said at least one sampled-voltage-value storage, for logically processing the at least one sampled voltage value, wherein said at least one logic-processor comprises
i) at least one sampled-voltage indicator structured and arranged to provide at least one indication of the at least one sampled voltage value,
ii) at least one comparator to compare the at least one indication of the at least one sampled voltage value with at least one of the plurality of programmable benchmark voltage values, and
iii) at least one output signal generator to generate at least one output signal from said at least one comparator; and
iv) at least one user-sensable signalling device controller, electrically coupled with said at least one output signal generator, structured and arranged to control at least one LED;
g) at least one LED socket having at least one retaining ring;
h) at least one ring connector;
i) at least one butt connector;
j) at least one cable tie;
k) at least one installation and operating instruction; and
l) at least one consumer package.

29. A kit system, containing at least one monitoring device for monitoring at least one vehicular electrical charging system, such kit system comprising:
a) at least one monitoring device comprising;
i) at least one continuous-accessor adapted to continuously access at least one operating voltage of said at least one vehicular electrical charging system by engaging at least one vehicular accessory power socket,
ii) at least one sampler, electrically coupled to said at least one continuous-accessor, structured and arranged to sample the at least one operating voltage, iii) at least one sampled voltage-value generator, electrically coupled to said at least one sampler, to provide at least one sampled voltage value for the at least one operating voltage,
iv) at least one benchmark memory device to store a plurality of programmable benchmark voltage values for the at least one operating voltage,
v) at least one storage memory, electrically coupled to said at least one sampler, to store the at least one sampled voltage value, and
vi) at least one logic-processor, electrically coupled to said at least one benchmark memory device and said at least one storage memory, structured and arranged to logically process the at least one sampled voltage value, wherein said at least one logic-processor comprises,
  (a) at least one sampled voltage indicator adapted to provide at least one indication of sampled voltage value,
  (b) at least one comparator to compare the at least one indication of sampled voltage value with at least one of the plurality of programmable benchmark voltage values,
  (c) at least one output signal device adapted to provide at least one output signal from said at least one comparator, and
vii) at least one visual signal device controller, electrically coupled with said at least one output signal device, structured and arranged to control at least one visual signal device;

b) at least one installation and operating instruction; and
c) at least one consumer package.

30. A method for providing vehicle-specific voltage monitoring systems for each of a plurality of differing motor vehicles each having at least one electrical charging system, such method comprising the steps of:
  a) identifying at least one plurality of such differing motor vehicles;
  b) assembling vehicle-specific benchmark voltage data for each one of such plurality of differing motor vehicles;
  c) providing at least one programmable device, adapted to in-vehicle use, structured and arranged to
    i) sample voltage from such electrical charging system and
    ii) compare such sampled voltage to the vehicle-specific benchmark voltage data;
  d) providing vehicle-specific software, using the vehicle-specific benchmark voltage data, such vehicle-specific software being downloadable to provide at least one program to such at least one in-vehicle programmable device; and
  e) providing to vehicle aftermarkets such vehicle-specific voltage monitoring systems.

* * * * *